(12) United States Patent
Ito

(10) Patent No.: US 11,387,258 B2
(45) Date of Patent: Jul. 12, 2022

(54) SUBSTRATE FOR ELECTRO-OPTICAL DEVICE, ELECTRO-OPTICAL DEVICE, AND ELECTRONIC APPARATUS

(71) Applicant: SEIKO EPSON CORPORATION, Tokyo (JP)

(72) Inventor: Satoshi Ito, Eniwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/678,371

(22) Filed: Nov. 8, 2019

(65) Prior Publication Data

US 2020/0152667 A1 May 14, 2020

(30) Foreign Application Priority Data

Nov. 12, 2018 (JP) .............................. JP2018-211981

(51) Int. Cl.
*H01L 27/14* (2006.01)
*H01L 27/12* (2006.01)
(Continued)

(52) U.S. Cl.
CPC ........ *H01L 27/1218* (2013.01); *G02F 1/1368* (2013.01); *G02F 1/133526* (2013.01);
(Continued)

(58) Field of Classification Search
CPC ............. G02F 1/1368; G02F 1/133526; G02F 1/136209; G02F 1/13685; G02F 2202/104;
(Continued)

(56) References Cited

U.S. PATENT DOCUMENTS 5,177,578 A * 1/1993 Kakinoki .............. H01L 29/045
257/E21.101
5,521,107 A * 5/1996 Yamazaki ............ G09G 3/3659
438/303
(Continued)

FOREIGN PATENT DOCUMENTS

JP 2005-285975 A 10/2005
JP 2012-009845 A 1/2012
(Continued)

OTHER PUBLICATIONS

Song, "Low Temperature Silicon Oxide and Fluorinated Silicon Oxide Films Prepared by Plasma-Enhanced Chemical Vapor Deposition Using Disilane as Silicon Precursor," PhD Dissertation at Louisiana State University (1996).*
(Continued)

*Primary Examiner* — Jay C Kim
(74) *Attorney, Agent, or Firm* — Oliff PLC

(57) ABSTRACT

An element substrate serving as a substrate for an electro-optical device includes a base material, a TFT disposed on the base material, the TFT including a semiconductor layer, and a first insulating film including a silicon oxide film disposed between the base material and the semiconductor layer, wherein a content of hydrogen in the silicon oxide film is $1.0 \times 10^{19}$ atoms/cm$^3$ or more but less than $1.0 \times 10^{20}$ atoms/cm$^3$.

5 Claims, 9 Drawing Sheets

(51) Int. Cl.
  *G02F 1/1368* (2006.01)
  *G02F 1/1362* (2006.01)
  *G02F 1/1335* (2006.01)
  *G03B 21/00* (2006.01)
  *H01L 29/786* (2006.01)
  *G03B 33/12* (2006.01)

(52) U.S. Cl.
  CPC ..... *G02F 1/136209* (2013.01); *G03B 21/006* (2013.01); *H01L 27/1222* (2013.01); *G02F 1/13685* (2021.01); *G02F 2202/104* (2013.01); *G03B 33/12* (2013.01); *H01L 29/78675* (2013.01)

(58) Field of Classification Search
  CPC ............. H01L 27/1218; H01L 27/1222; H01L 29/78675; G03B 21/006
  See application file for complete search history.

(56) References Cited

U.S. PATENT DOCUMENTS

| | | | | |
|---|---|---|---|---|
| 5,883,016 | A * | 3/1999 | Chan | H01J 37/32412 438/798 |
| 7,187,587 | B2 * | 3/2007 | Forbes | G11C 8/10 257/135 |
| 7,897,482 | B2 * | 3/2011 | Toriumi | H01L 27/1214 438/458 |
| 8,148,236 | B2 * | 4/2012 | Takahashi | H01L 27/1266 438/455 |
| 8,304,775 | B2 * | 11/2012 | Miyairi | H01L 51/52 257/59 |
| 8,441,010 | B2 * | 5/2013 | Ichijo | H01L 29/7869 257/43 |
| 8,552,425 | B2 * | 10/2013 | Ichijo | H01L 29/78696 257/43 |
| 8,642,412 | B2 * | 2/2014 | Yamazaki | H01L 23/564 438/158 |
| 8,842,060 | B2 * | 9/2014 | Yamashita | G09G 3/3233 345/77 |
| 8,937,313 | B2 * | 1/2015 | Chung | H01L 27/1218 257/66 |
| 9,142,425 | B2 * | 9/2015 | Ando | H01L 21/428 |
| 9,490,368 | B2 * | 11/2016 | Kimura | H01L 29/66969 |
| 9,543,290 | B2 * | 1/2017 | Hekmatshoartabari | H01L 27/0617 |
| 9,698,274 | B2 * | 7/2017 | Yamazaki | H01L 27/1225 |
| 9,704,704 | B2 * | 7/2017 | Yamazaki | H01L 21/02323 |
| 9,818,775 | B2 * | 11/2017 | Long | H01L 29/78618 |
| 9,905,156 | B2 * | 2/2018 | Nakao | G09G 3/3225 |
| 10,026,654 | B2 * | 7/2018 | Kenji | H01L 29/16 |
| 10,043,822 | B2 * | 8/2018 | Lee | H01L 28/00 |
| 10,056,497 | B2 * | 8/2018 | Tanaka | H01L 29/78606 |
| 10,074,675 | B2 * | 9/2018 | Shin | H01L 29/78675 |
| 10,134,331 | B2 * | 11/2018 | Yamashita | G09G 3/3233 |
| 10,141,190 | B2 * | 11/2018 | Isogai | H01L 27/1248 |
| 10,217,681 | B1 * | 2/2019 | Royer | H01L 21/31116 |
| 10,263,060 | B2 * | 4/2019 | Noh | H01L 27/3262 |
| 10,290,657 | B2 * | 5/2019 | Hanyu | H01L 27/1225 |
| 10,340,320 | B2 * | 7/2019 | Lee | H01L 27/1225 |
| 10,468,434 | B2 * | 11/2019 | Lee | H01L 27/1259 |
| 10,476,020 | B2 * | 11/2019 | Kurata | H01L 27/1248 |
| 10,861,733 | B2 * | 12/2020 | Ohno | H01L 21/481 |
| 2005/0258427 | A1 * | 11/2005 | Chan | H01L 29/66787 257/72 |
| 2011/0222008 | A1 | 9/2011 | Moriwaki et al. | |
| 2011/0284854 | A1 | 11/2011 | Endo et al. | |
| 2015/0053975 | A1 | 2/2015 | Endo et al. | |
| 2016/0380106 | A1 | 12/2016 | Endo et al. | |
| 2018/0277387 | A1 * | 9/2018 | Royer | H01L 21/28132 |
| 2019/0064585 | A1 | 2/2019 | Ito | |
| 2020/0310187 | A1 * | 10/2020 | Takahashi | G02F 1/13452 |

FOREIGN PATENT DOCUMENTS

| | | | | |
|---|---|---|---|---|
| JP | 2014-153384 A | | 8/2014 | |
| JP | 2015-228033 A | | 12/2015 | |
| JP | WO 2018/033817 | * | 2/2018 | .............. G09F 9/30 |
| JP | 2019-040151 A | | 3/2019 | |

OTHER PUBLICATIONS

Kim et al., "Effect of fluorine incorporation on silicon dioxide prepared by high density plasma chemical vapor deposition with SiH4/O2/NF3 chemistry," Journal of Applied Physics 96 (2004) pp. 1435-1442.*

Ding et al., "Structure characterization of carbon and fluorine-doped silicon oxide films with low dielectric constant," Materials Chemistry and Physics 71 (2001) pp. 125-130.*

Navi et al., "Interactions of Fluorine Redistribution and Nitrogen Incorporation with Boron Diffusion in Silicon Dioxide," IEEE (1997) pp. 335-338.*

Chern et al., "The Effects of Fluorine Passivation on Polysilicon Thin-Film Transistors," IEEE Transactions on Electron Devices (1994) pp. 698-702.*

Rettmann, "Development of low temperature oxidation for crystalline silicon thin film transistor applications," Master of Science Thesis at Rochester Institute of Technology (2011).*

* cited by examiner

SUBSTRATE FOR ELECTRO-OPTICAL DEVICE, ELECTRO-OPTICAL DEVICE, AND ELECTRONIC APPARATUS

The present application is based on, and claims priority from JP Application Serial Number 2018-211981, filed Nov. 12, 2018, the disclosure of which is hereby incorporated by reference herein in its entirety.

BACKGROUND

1. Technical Field

The present disclosure relates to a substrate for an electro-optical device, an electro-optical device, and an electronic apparatus.

2. Related Art

As an electro-optical device, there is known a liquid crystal apparatus of active drive-type in which switching control of pixels is performed by a transistor provided at a substrate for an electro-optical device. When such a liquid crystal apparatus of active drive-type is used for, for example, a light modulating unit of a projector, a part of light incident on the pixel from the light source of the projector reaches the semiconductor layer of the transistor, then an optical leakage current occurs in the transistor. A light-shielding structure is required for blocking light incident on the semiconductor layer of the transistor to prevent the operation of the transistor from being unstabilized due to the occurrence of the optical leakage current.

For example, JP 2015-228033 A discloses an electro-optical device including, on a substrate, a storage capacitor electrically coupled to a transistor between a pixel electrode provided for each of the pixels and the transistor, and a light-shielding film disposed between the storage capacitor and the pixel electrode to at least partially overlap with the transistor. In addition, the electro-optical device of JP 2015-228033 A provides an example in which a scanning line being a signal wiring is disposed between the substrate and the transistor. The scanning line, which is formed using a light-shielding material, is provided at a position at which the scanning line overlaps with the transistor. Thus, the above-described light-shielding film functions as an upper-side light-shielding film that blocks light incident from above on the transistor, and the scanning line functions as a lower-side light-shielding film that blocks light incident on the transistor from the substrate side, that is, from below. That is, the light-shielding structures, which are introduced to the upper side and the lower side of the transistor, make it possible to reliably prevent the occurrence of optical leakage current in the transistor.

The above-described JP 2015-228033 A describes an example in which an underlying insulating film is provided between a scanning line and a semiconductor layer of the transistor. A formation of the underlying insulating film over the entire surface of the substrate on which the scanning lines are formed prevents the characteristics of the transistors for pixel switching from being deteriorated due to roughness when polishing of the surface of the substrate, and dirt remaining after cleaning is performed. However, the above-described JP 2015-228033 A does not describe a specific method of forming the underlying insulating film. Accordingly, the characteristics of the transistor may be affected, depending on the condition of the underlying insulating film formed at the lower layer of the semiconductor layer. For example, when forming of the semiconductor layer on the underlying insulating film, or after the formation of the semiconductor layer on the underlying insulating film, the elements included in the underlying insulating film are diffused into the semiconductor layer, thereby changing the electrical properties in the semiconductor layer and making it difficult to provide a desired characteristics of the transistor.

SUMMARY

A substrate for an electro-optical device of the present disclosure includes a base material, a transistor disposed on the base material, the transistor including a semiconductor layer, and a silicon oxide film disposed between the base material and the semiconductor layer, wherein a content of hydrogen in the silicon oxide film is $1.0\times10^{19}$ atoms/cm$^3$ or more but less than $1.0\times10^{20}$ atoms/cm$^3$.

In the substrate for an electro-optical device described above, the semiconductor layer includes a polysilicon film.

In the substrate for an electro-optical device described above, a content of fluorine in the silicon oxide film may be less than $1.0\times10^{19}$ atoms/cm$^3$.

In the substrate for an electro-optical device described above, an etching rate for the silicon oxide film by using hydrofluoric acid having a concentration of 1.0 mass % may be 6.8 nm/min or more but 20 nm/min or less.

In the substrate for an electro-optical device described above, a microlens array including microlenses arranged for pixels respectively may be provided between the base material and the silicon oxide film.

In the substrate for an electro-optical device described above, a light-shielding film may be provided between the silicon oxide film and the semiconductor layer in a region overlapping the semiconductor layer in plan view, wherein the light-shielding film may include a metal or a metal compound devoid of silicon.

In the substrate for an electro-optical device described above, a film thickness of the silicon oxide film may be 1 μm or more.

The electro-optical device of the present disclosure includes the substrate for an electro-optical device described above, a counter substrate, and an electro-optical layer disposed between the substrate for an electro-optical device and the counter substrate, wherein the electro-optical layer is configured to be electrically driven by the transistor of the substrate for an electro-optical device.

An electronic apparatus according to the present disclosure includes the electro-optical device described above.

DESCRIPTION OF EXEMPLARY EMBODIMENTS

Embodiments of the present disclosure will be described below with reference to the accompanying drawings. Note that, in the following drawings, parts described are illustrated in an enlarged or reduced state as appropriate to the extent that the parts can be recognized.

1. First Embodiment

1-1. Electro-optical Device

In the first embodiment, a liquid crystal apparatus of active drive-type including a Thin Film Transistor (TFT) being a switching element for each of the pixels will be described as an example of the electro-optical device. The liquid crystal apparatus is a compact display device that can be favorably used for a light modulation unit of a projection-type display apparatus to be described below, for example.

Figure 1:
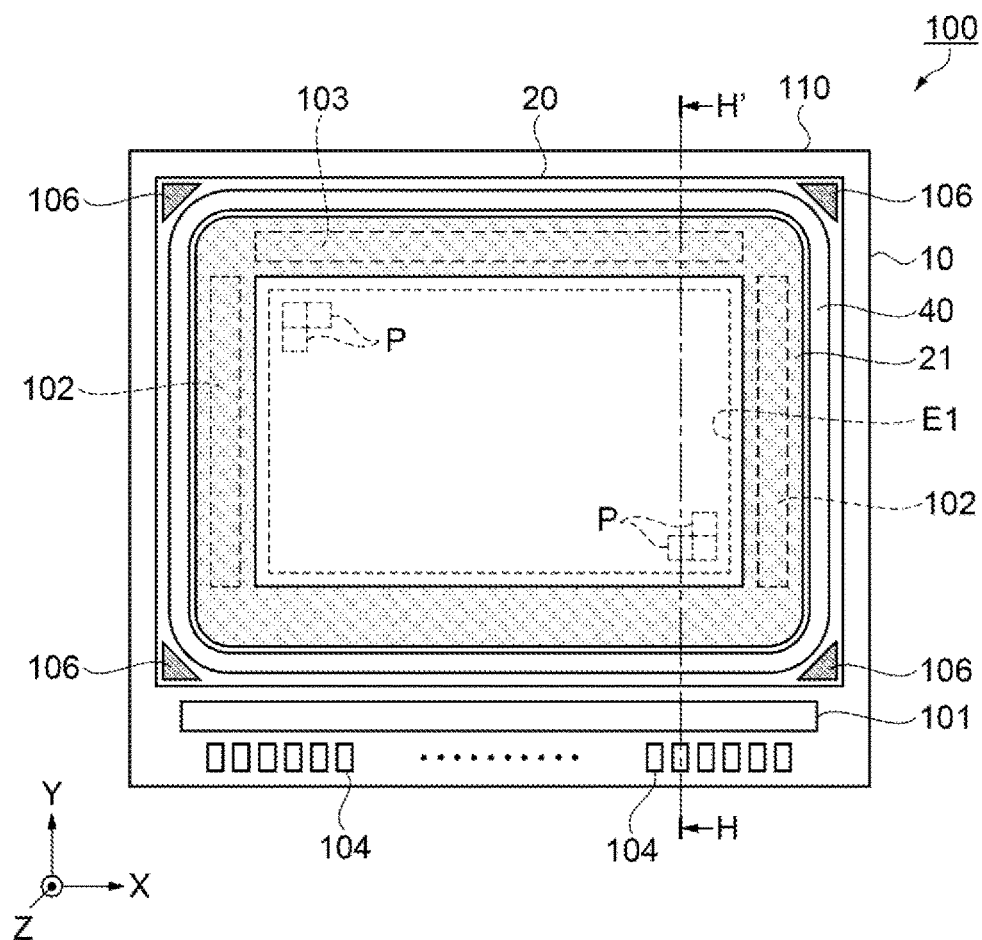
FIG. 1 is a plan view schematically illustrating a configuration of a liquid crystal apparatus as an electro-optical device according to a first embodiment.
Figure 2:
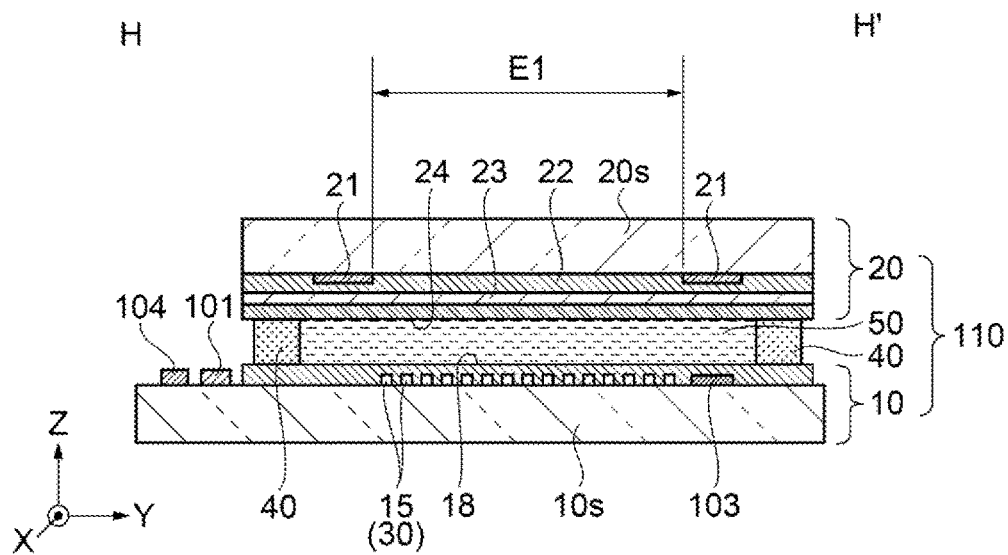
FIG. 2 is a cross-sectional view schematically illustrating a structure of a liquid crystal apparatus taken along line H-H' in FIG. 1.
Figure 3:
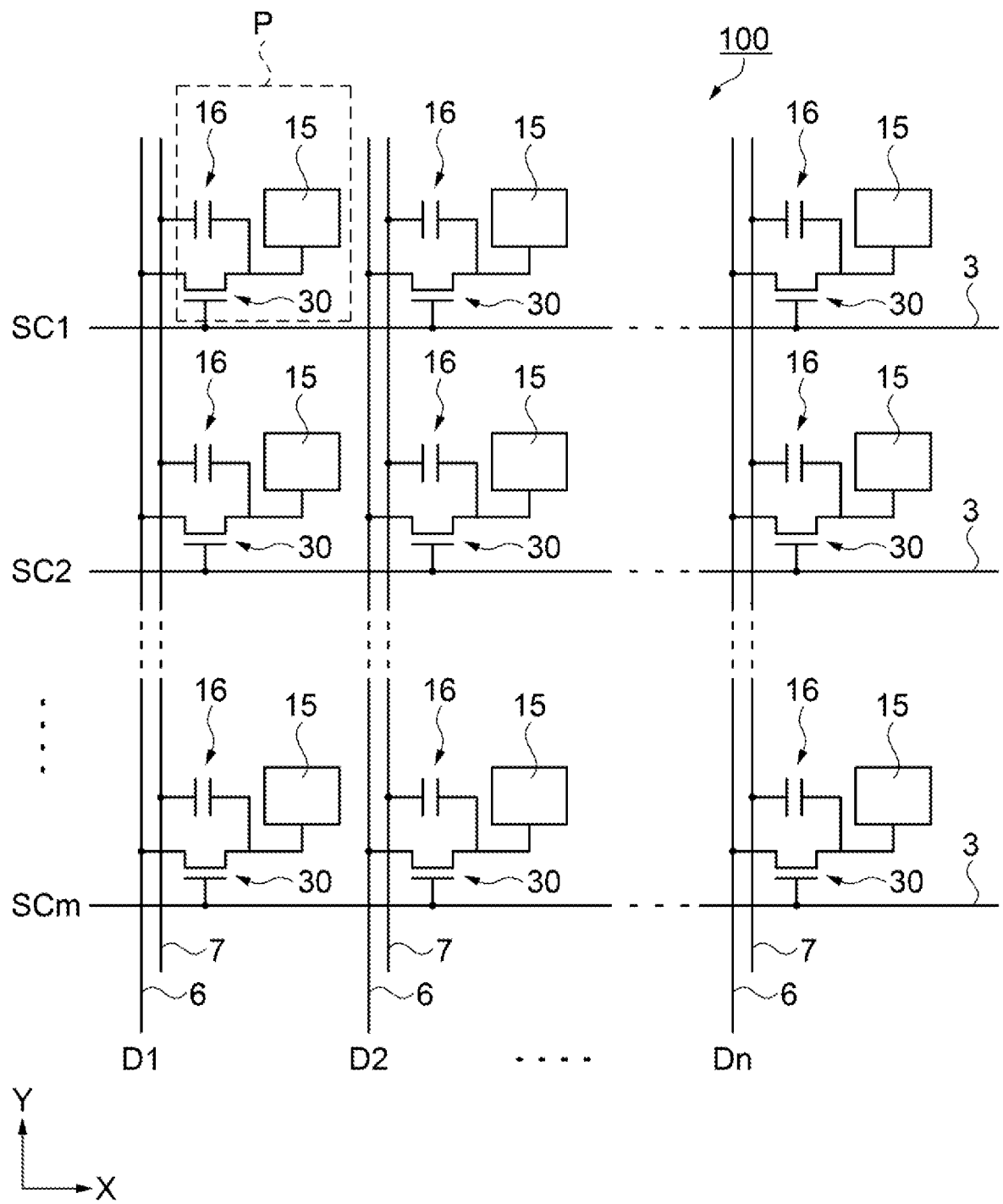
FIG. 3 is an equivalent circuit diagram illustrating an electrical configuration of a liquid crystal apparatus.

First, a liquid crystal apparatus as an electro-optical device according to the first embodiment will be described below with reference to FIGS. 1 to 3. FIG. 1 is a plan view schematically illustrating a configuration of a liquid crystal apparatus as an electro-optical device according to the first embodiment. FIG. 2 is a cross-sectional view schematically illustrating a structure of the liquid crystal apparatus taken along line H-H' in FIG. 1. FIG. 3 is an equivalent circuit diagram illustrating an electrical configuration of the liquid crystal apparatus.

As illustrated in FIGS. 1 and 2, a liquid crystal apparatus 100 serving as the electro-optical device of the first embodiment includes a liquid crystal panel 110 provided with an element substrate 10 and a counter substrate 20 disposed facing each other, and a liquid crystal layer 50 interposed in between the pair of substrates. For example, a transparent quartz substrate or glass substrate is used for each of a base material 10s of the element substrate 10 and a base material 20s of the counter substrate 20. The element substrate 10 is an example of the substrate for an electro-optical device of the present disclosure, and the liquid crystal layer 50 is an example of the electro-optical layer of the present disclosure.

The element substrate 10 has a size larger than the counter substrate 20, and both substrates are affixed together, creating a spacing in between, with a sealing portion 40 disposed along an outer edge of the counter substrate 20. A liquid crystal is implanted into the inner side of the sealing portion 40 disposed in a frame shape, to thus configure the liquid crystal layer 50. Note that the method of implanting a liquid crystal in the above-described spacing includes, for example, One Drop Fill (ODF) method, in which a liquid crystal are dripped into the inner side of the sealing portion 40 disposed in a frame shape, and then the element substrate 10 and the counter substrate 20 are bonded together under a reduced pressure.

For the sealing portion 40, an adhesive such as a thermosetting or ultraviolet curable epoxy resin can be used, for example. In the first embodiment, an ultraviolet curable type epoxy resin is employed. Non-illustrated spacers are mixed into the sealing portion 40 to maintain the spacing in between the pair of substrates constant.

A display region E1 in which a plurality of pixels P are arrayed in a matrix pattern is provided at the inner side of the sealing portion 40. Further, a partition portion 21 having light-shielding properties is provided surrounding the display region E1, between the sealing portion 40 and the display region E1. The partition portion 21 includes, for example, a metal or a metal oxide having light-shielding properties. Note that the display region E1 may include a plurality of dummy pixels, in addition to the plurality of operative pixels P that contribute to the display.

The element substrate 10 is provided with a terminal portion in which a plurality of external coupling terminals 104 are aligned. A data-line drive circuit 101 is provided between a first side portion along the terminal portion, and the sealing portion 40. Further, an inspection circuit 103 is provided between the sealing portion 40 along a second side portion opposing the first side portion, and the display region E1. Moreover, scanning line drive circuits 102 are provided between the sealing portion 40 along a third and a fourth side portions, opposing each other, orthogonal to the first side portion, and the display region E1. Between the sealing portion 40 of the second side portion, and the inspection circuit 103, there are provided a plurality of wirings (not illustrated) that link two scanning line drive circuits 102.

The wirings (not illustrated) linked to the data-line drive circuit 101 and the scanning line drive circuit 102 are coupled to the plurality of external coupling terminals 104 aligned along the first side portion. Note that the inspection circuit 103 may be provided, without being limited to the above, at a position along the inner side of the sealing portion 40 between the data-line drive circuit 101 and the display region E1.

Hereinafter, descriptions will be given assuming that a direction along the first side portion is an X direction, and a direction along the third side portion is a Y direction. Further, a direction orthogonal to both the X direction and the Y direction and oriented from the element substrate 10 side toward the counter substrate 20 side is referred to as Z direction. In addition, viewing from the direction opposite to the Z direction from the counter substrate 20 side toward the element substrate 10 side is referred to as a plan view or planarly.

As illustrated in FIG. 2, on the surface of the element substrate 10 at the liquid crystal layer 50 side, a pixel electrode 15 of light translucency and a TFT 30 being a switching element, which are provided for each of the pixels P, and signal wirings, and an alignment film 18 covering these components are arranged. The element substrate 10 includes the base material 10s, and the pixel electrodes 15, the TFT 30, the signal wirings, and the alignment film 18 that are arranged on the base material 10s. A detailed configuration of the element substrate 10 as the substrate for an electro-optical device will be described below.

The counter substrate 20 includes the base material 20s, a partition portion 21 provided at the base material 20s, a planarization layer 22 film formed covering the partition portion 21 and the base material 20s, a counter electrode 23 covering the planarization layer 22, provided over substantially the entire surface of the base material 20s, and serving as a common electrode, and an alignment film 24 covering the counter electrode 23.

As illustrated in FIG. 1, the partition portion 21 is provided, surrounding the display region E1, at a position planarly overlapping with the scanning line drive circuit 102 and the inspection circuit 103. This allows the partition portion 21 to block light incident on these circuits from the counter substrate 20 side, to thus serve to prevent these circuits from malfunctioning due to the light. Further, the partition portion 21 blocks light to prevent unnecessary stray light from being incident on the display region E1, ensuring high contrast in the display of the display region E1. Note that in the first embodiment, the sealing portion 40 is formed using an ultraviolet curable type epoxy resin, and thus the partition portion 21 is disposed not to overlap with the sealing portion 40 in plan view. Accordingly, a gap (see FIG. 1), which is merely a slight gap, is provided in plan view between the partition portion 21 and the sealing portion 40, in view of the positional accuracy in bonding between the element substrate 10 and the counter substrate 20, and the ultraviolet-light curing properties of the sealing portion 40.

The planarization layer 22 includes, for example, an inorganic material such as a silicon oxide, has an optical transparency, and is provided covering the partition portion 21. The planarization layer 22 thus configured may be formed by film formation method using, for example, plasma Chemical Vapor Deposit (CVD) method or the like.

The counter electrode 23 includes, for example, a transparent conductive film such as an Indium Tin Oxide (ITO) film. The counter electrode 23 covers the planarization layer 22 and is electrically coupled to vertical conducting portions 106 provided at four corners of the counter substrate 20, as illustrated in FIG. 1. The vertical conducting portion 106 is electrically coupled to wirings at the element substrate 10 side.

The alignment film 18 covering the pixel electrode 15 and the alignment film 24 covering the counter electrode 23 are selected based on an optical design of the liquid crystal apparatus 100. The alignment films 18 and 24 are, for example, an organic alignment film formed such that an organic material such as polyimide is film formed, and the surface of the film is rubbed to cause the film to be subjected to substantially horizontal alignment treatment with respect to liquid crystal molecules having positive dielectric anisotropy, or an inorganic alignment film formed such that an inorganic material such as SiOx (silicon oxide) is film formed using vapor phase growth method, and is then aligned substantially vertically with respect to liquid crystal molecules having negative dielectric anisotropy.

The liquid crystal apparatus 100 thus configured is of a transmissive-type, and the design employed is an optical design of a normally white mode in which the transmittance of the pixel P is maximized under a state of voltage being not applied, and a normally black mode in which the transmittance of the pixel P is minimized under a state of voltage being not applied. A polarization element is disposed to be used, on each of a light incidence side and a light exit side of the liquid crystal panel 110 including the element substrate 10 and the counter substrate 20, in accordance with the optical design. In FIG. 2, the polarization element is omitted to be illustrated.

In the first embodiment, an example is described, in which the optical design of the normally black mode is applied, using the inorganic alignment films described as the alignment films 18 and 24, and a liquid crystal material having negative dielectric anisotropy.

Next, an electrical configuration of the liquid crystal apparatus 100 will be described below with reference to FIG. 3. The liquid crystal apparatus 100 includes a plurality of scanning lines 3 and a plurality of data lines 6 as signal wirings insulated from one another and orthogonal to one another at least in the display region E1, and a capacitance line 7 disposed in parallel with the data line 6. The direction in which the scanning line 3 extends is the X direction, and the direction in which the data line 6 extends is the Y direction.

The scanning line 3, the data line 6, and the capacitance line 7, and the pixel electrode 15, the TFT 30 being a thin film transistor of N-channel type as a switching element, and a storage capacitor 16 in each of the regions partitioned by these signal wirings are provided, and these wirings and components constitute a pixel circuit of the pixel P.

The scanning line 3 is electrically coupled to a gate of the TFT 30, and the data line 6 is electrically coupled to a source of the TFT 30. The pixel electrode 15 is electrically coupled to a drain of the TFT 30.

The data lines 6 coupled to the data-line drive circuit 101 (see FIG. 1) supply image signals D1, D2, . . . , and Dn supplied from the data-line drive circuit 101 to the pixels P. The scanning lines 3 coupled to the scanning line drive circuit 102 (see FIG. 1) supply, to the pixels P, scanning signals SC1, SC2, . . . , and SCm supplied from the scanning line drive circuit 102.

The image signals D1 to Dn supplied from the data-line drive circuit 101 to the data lines 6 may be line-sequentially supplied in this order, or may be supplied to the plurality of respective data lines 6 adjacent to each other in groups. The scanning line drive circuit 102 line-sequentially supplies the scan signals SC1 to SCm to the scanning lines 3 in a pulsed manner at predetermined timings.

The liquid crystal apparatus 100 is configured such that the TFT 30 being a switching element is turned to be on state only for a certain period by an input of the scan signals SC1 to SCm and thus, the image signals D1 to Dn supplied from the data lines 6 are written in the pixel electrodes 15 at predetermined timings. The image signals D1 to Dn of a predetermined level written into the liquid crystal layer 50 via pixel electrodes 15 are held for a certain period between the pixel electrodes 15 and the counter electrode 23, which are arranged facing the pixel electrodes 15 being intervened by the liquid crystal layer 50. The frequency of the image signals D1 to Dn is 60 Hz, for example.

To prevent the image signals D1 to Dn held from leaking, the storage capacitor 16 is coupled in parallel with liquid crystal capacitor provided between the pixel electrode 15 and the counter electrode 23. The storage capacitor 16 is provided between the drain of the TFT 30 and the capacitance line 7.

Note that although the inspection circuit 103 illustrated in FIG. 1 is coupled with the data lines 6, and is configured to be able to detect the image signals described above to confirm operational defects and the like of the liquid crystal apparatus 100 in a manufacturing process of the liquid crystal apparatus 100, the above configuration is omitted in the equivalent circuit of FIG. 3.

The peripheral circuits configured to drive and control the pixel circuit in the first embodiment includes the data-line drive circuit 101 and the scanning line drive circuit 102. In addition, the peripheral circuits may include a sampling circuit configured to sample the image signals described above and to supply the image signals to the data lines 6, and a precharge circuit configured to supply precharge signals at predetermined voltage level to the data lines 6 in advance of the supply of the image signals. As described, for example, in JP 2005-70630 A, the data-line drive circuit 101 and the scanning line drive circuit 102 include a shift register, a buffer, or the like provided with a complementary circuit that combines a thin film transistor of N-channel type and a thin film transistor of P-channel type. Hereinafter, the thin film transistor of N-channel type is referred to as Nch-TFT, and the thin film transistor of P-channel type is referred to as Pch-TFT. is designated as Pch type TFT.

1-2. Structure of Pixel

Figure 4:
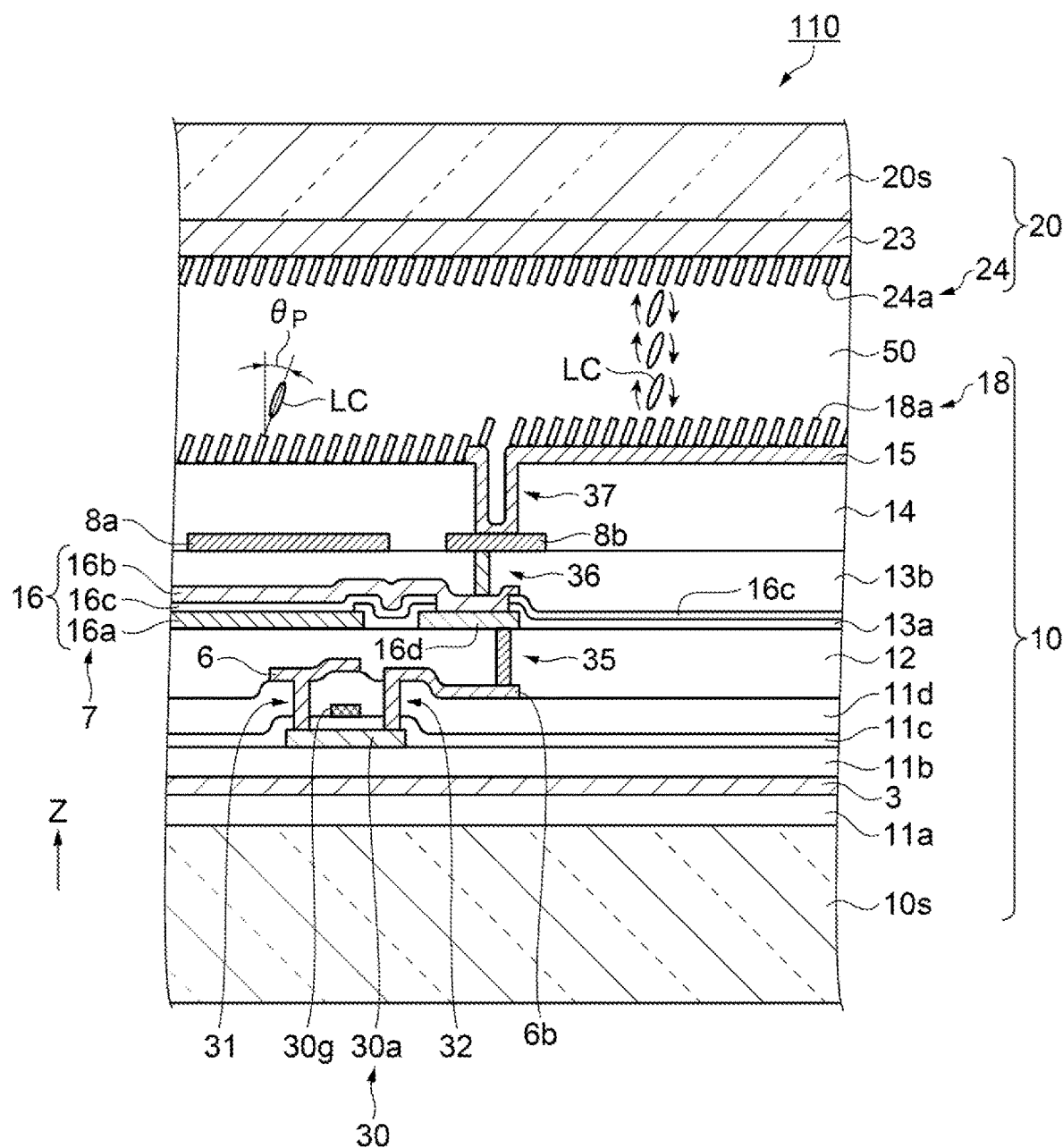
FIG. 4 is a cross-sectional view schematically illustrating a structure of a pixel of a liquid crystal apparatus.

Next, a structure of the pixel P in the liquid crystal panel 110 of the liquid crystal apparatus 100 of the first embodiment will be described below. FIG. 4 is a cross-sectional view schematically illustrating a structure of a pixel of the liquid crystal apparatus.

As illustrated in FIG. 4, a first insulating film 11a is firstly formed, covering one surface of the base material 10s, on the base material 10s composed of, for example, a quartz substrate, of the element substrate 10. The first insulating film 11a is an example of the silicon oxide film of the present disclosure. Examples of the method of forming the silicon oxide film constituting the first insulating film 11a include a method of forming the silicon oxide film, by plasma CVD method or high density plasma CVD method, using a film forming gas including monosilane ($SiH_4$), oxygen ($O_2$), and a carrier gas such as argon (Ar) or helium (He). Hereinafter, in this specification, the plasma CVD method is referred to as PE-CVD method, and the high density plasma CVD method is referred to as HDP-CVD method. The low pressure CVD method is also referred to as LP-CVD method.

In the first embodiment, a silicon oxide film having the content of hydrogen (H) of not less than $1.0 \times 10^{19}$ atoms/cm$^3$ and less than $1.0 \times 10^{20}$ atoms/cm$^3$ is formed by HDP-CVD method using a film forming gas containing monosilane to form the first insulating film 11a.

Further, according to such a method of forming a silicon oxide film, the content of fluorine (F) contained in the first insulating film 11a can be less than $1.0 \times 10^{19}$ atoms/cm$^3$.

The method of forming a silicon oxide film includes a forming method by thermally decomposing tetraethoxysilane (TEOS), which is an organic material, by PE-CVD method or LP-CVD method. According to such a method using TEOS, the content of hydrogen (H) and fluorine (F) contained in the silicon oxide film is difficult to be within the range described above. Specifically, the method using TEOS, has an advantage in terms of the deposition rate compared to the method using monosilane, however, has a disadvantage in that it is necessary to frequently clean inside the chamber using cleaning gases containing fluorine (F) such as carbon tetrafluoride ($CF_4$), hexafluoroethane ($C_2F_6$), and nitrogen trifluoride ($NF_3$) to remove unnecessary silicon oxide films deposited within the chamber of PE-CVD device or LP-CVD device. Because of the above, the fluorine (F) remaining in the chamber is easily incorporated in the film formation of silicon oxide film after the cleaning, thus making it difficult to control the content of fluorine (F), in particular.

Note that the above-described contents of hydrogen (H) and fluorine (F) contained in the silicon oxide film constituting the first insulating film 11a are the values after a high-temperature heat treatment at 1000° C. involved in the formation of a semiconductor layer 30a that will be formed afterward. In other words, when a high-temperature heat treatment is performed, hydrogen (H) and fluorine (F) are heat-diffused, to thus reduce the content of hydrogen (H) and fluorine (F) contained in the silicon oxide film compared to during the film formation. Further, in view of ensuring the amount of hydrogen (H) contained in the silicon oxide film, the film thickness of the first insulating film 11a may further be 1 μm or greater. Moreover, the temperature at which the hydrogen (H) contained in the silicon oxide film is heat-diffused may be not lower than 300° C., and lower than the melting point of the base material 10s (in the first embodiment, the base material 10s is a quartz substrate, and of which the melting point is 1600° C.), which is not higher than 1300° C. Thus, even if a high-temperature heat treatment is performed at not lower than 300° C. after the formation of the semiconductor layer 30a, the hydrogen (H) is heat-diffused from the silicon oxide film.

Next, the scanning line 3 is formed at the first insulating film 11a. The scanning line 3 is formed using a metal selected from among high-melting point metals such as Cr (chromium), W (tungsten), Mo (molybdenum), Ti (titanium), Zr (zirconium), and Hf (hafnium), or using alloys or metal compounds such as silicides of these metals. That is, the film thickness of the scanning line 3 is, for example, 200 nm.

Next, a second insulating film 11b is formed covering the scanning line 3. Because the semiconductor layer 30a is subsequently formed at the second insulating film 11b, the second insulating film 11b is formed using a silicon oxide film (Non-doped Silicate Glass film: NSG film) or a silicon nitride film ($Si_xN_y$ film) into which impurities are not intentionally introduced. Note that the silicon oxide film of the present disclosure may be applied to the second insulating film 11b, however, provided that the film thickness is set at 1 μm or greater, stray light that is incident from the base material 10s side and diffracted at the end portion of the scanning line 3 is easily made incident on the semiconductor layer 30a to lower the light-shielding properties of the scanning line 3 with respect to the semiconductor layer 30a. Thus, the film thickness of the second insulating film 11b is set at 200 nm, for example.

Next, the semiconductor layer 30a is formed in an island shape on the second insulating film 11b. The semiconductor layer 30a is composed of a polycrystalline silicon film, where impurity ions are selectively implanted into the semiconductor layer 30a, to thus form a Lightly Doped Drain (LDD) structure, which includes a channel region, low-concentration impurity regions that interpose the channel region, and a high-concentration impurity region in contact with the low-concentration impurity regions. Examples of the method of forming the polysilicon film include a method in which the amorphous silicon film formed by LP-CVD method is subjected to a heat treatment for 5 minutes or longer at a high temperature of 1000° C. to be crystallized to obtain the amorphous silicon film.

The light incident on the semiconductor layer 30a from the base material 10s side is blocked by the scanning line 3, because the semiconductor layer 30a is provided, intervened by the second insulating film 11b, above the scanning line 3 having light-shielding properties. This prevents an optical leakage current in the TFT 30 due to the incident light from occurring to make the operation become unstable. Moreover, hydrogen (H) is diffused, due to the high-temperature heat treatment when forming of the semiconductor layer 30a, from the first insulating film 11a into the semiconductor layer 30a, and sintering effect is obtained in which crystal defects of the semiconductor layer 30a composed of a polysilicon film is repaired with hydrogen (H), thus improving the electrical characteristics of the semiconductor layer 30a.

Next, a gate insulating film 11c is formed covering the semiconductor layer 30a. The gate insulating film 11c is, for example, a silicon oxide film with a film thickness of 30 nm, which is formed by LP-CVD method on a surface of the semiconductor layer 30a composed of a polysilicon film oxidized prior to the formation of the gate insulating film 11c. A gate electrode 30g is further formed at a position facing the channel region with the gate insulating film 11c interposed in between. In the first embodiment, a part of the wiring electrically coupled to the scanning line 3 serves as the gate electrode 30g. An electrical coupling between the scanning line 3 and the gate electrode 30g will be described below.

A first interlayer insulating film 11d is formed covering the gate electrode 30g and the gate insulating film 11c. The first interlayer insulating film 11d is composed of, for example, a silicon oxide film formed by PE-CVD method as well. The film thickness of the first interlayer insulating film 11d is, for example, 500 nm.

Next, through holes passing through the gate insulating film 11c and the first interlayer insulating film 11d are formed at positions overlapping with the respective end portions of the semiconductor layer 30a. Then, an conductive film having light-shielding properties, such as aluminum (Al), or an alloy or metal compound of Al, an impurity doped polysilicon, or the like, is film formed to fill the through holes, covering the first interlayer insulating film 11d, and the conductive film is patterned to form the data line 6 linked to the source of the TFT 30 via a contact hole 31. Concurrently with the above, a first relay electrode 6b linked to the drain of the TFT 30 via a contact hole 32 is formed.

Next, a second interlayer insulating film 12 is formed covering the data line 6, the first relay electrode 6b, and the first interlayer insulating film 11d. The second interlayer insulating film 12 is composed of, for example, a silicon oxide film formed by PE-CVD method as well. Then, a planarization treatment is performed to planarize the unevenness of the surface, which occurred by covering of the region in which the TFTs 30 are provided. Examples of the planarization treatment include Chemical Mechanical Polishing treatment (CMP treatment), etching treatment, and a method in which these treatments are performed in a combined manner. The average film thickness of the second interlayer insulating film 12 after the planarization treatment is, for example, 500 nm.

Next, a through hole is formed through the second interlayer insulating film 12 at a position planarly overlapping with the first relay electrode 6b. A conductive film having light-shielding properties, such as aluminum (Al), or an alloy or metal compound of Al, is formed covering inside the through hole and covering the second interlayer insulating film 12, and the conductive film is patterned to form a first capacitance electrode 16a, and a second relay electrode 16d electrically coupled to the first relay electrode 6b via a contact hole 35.

A protective insulating film 13a is formed being patterned covering an outer edge of a portion of the first capacitance electrode 16a, where the portion faces a second capacitance electrode 16b with intervening a dielectric film 16c that will be formed afterward. The protective insulating film 13a is formed being patterned covering an outer edge of the second relay electrode 16d, which excludes the portion overlapping with a contact hole 36 to be described below. The protective insulating film 13a is provided to prevent the first capacitance electrode 16a from being etched in patterning of the second capacitance electrode 16b that is subsequently formed.

Next, the dielectric film 16c is film formed covering the protective insulating film 13a and the first capacitance electrode 16a. The dielectric film 16c may be formed using a single layer film such as a silicon nitride film, hafnium oxide ($HfO_2$), alumina ($Al_2O_3$), tantalum oxide ($Ta_2O_5$), or the like, or a multilayer film in which at least two types of single-layer film of these single layer films are layered. A film thickness of the dielectric film 16c is, for example, 30 nm. The dielectric film 16c at a portion planarly overlapping with the second relay electrode 16d is etched and removed. A conductive film, such as titanium nitride (TiN), for example, is formed covering the dielectric film 16c, and the conductive film is patterned to form the second capacitance electrode 16b disposed facing the first capacitance electrode 16a and linked to the second relay electrode 16d. The storage capacitor 16 is configured with the dielectric film 16c, and the first capacitance electrode 16a and the second capacitance electrode 16b disposed facing each other across the dielectric film 16c.

Next, a third interlayer insulating film 13b is formed covering the second capacitance electrode 16b and the dielectric film 16c. The third interlayer insulating film 13b is a silicon oxide film formed by CVD method as well. Then, the third interlayer insulating film 13b is subjected to a planarization treatment such as CMP treatment. The average film thickness of the third interlayer insulating film 13b after the planarization treatment is, for example, 400 nm. The film thicknesses of the protective insulating film 13a and the dielectric film 16c are thinner than the film thickness of the third interlayer insulating film 13b. The protective insulating film 13a and the dielectric film 16c are not necessarily be formed over the entire surface of the base material 10s, and may be patterned in accordance with the disposition of the storage capacitor 16.

A through hole is formed through the third interlayer insulating film 13b to reach a portion of the second capacitance electrode 16b, which is in contact with the second relay electrode 16d.

An conductive film having light-shielding properties such as aluminum (Al), or an alloy or metal compound of Al, is formed covering inside the through hole and covering the third interlayer insulating film 13b, and the conductive film is patterned to form a wiring 8a, and a third relay electrode 8b electrically coupled to the second relay electrode 16d via the contact hole 36. The wiring 8a is formed planarly overlapping with the semiconductor layer 30a of the TFT 30, the data line 6, and the storage capacitor 16, and serves as a shield layer to which a fixed potential is applied.

A fourth interlayer insulating film 14 is formed covering the wiring 8a and the third relay electrode 8b. For the fourth interlayer insulating film 14, a silicon oxide film or a silicon nitride film formed by PE-CVD method can be used as well. A through hole is formed through the fourth interlayer insulating film 14 to reach the third relay electrode 8b.

A transparent conductive film (electrode film) such as ITO is formed covering inside the through hole and covering the fourth interlayer insulating film 14. The transparent conductive film (electrode film) is patterned to form the pixel electrode 15 that is electrically linked to the third relay electrode 8b via a contact hole 37.

The third relay electrode 8b is electrically coupled to the drain of the TFT 30 via the contact hole 36, the second capacitance electrode 16b, the second relay electrode 16d, the contact hole 35, and the first relay electrode 6b, and is electrically coupled to the pixel electrode 15 via the contact hole 37.

The first capacitance electrode 16a is formed across a plurality of pixels P, and serves as the capacitance line 7 in the equivalent circuit (see FIG. 3). The first capacitance electrode 16a is applied with a fixed potential. This enables the electric potential supplied to the pixel electrode 15 via the drain of the TFT 30 to be held between the first capacitance electrode 16a and the second capacitance electrode 16b.

The alignment film 18 is formed covering the pixel electrode 15, and an alignment film 24 is formed covering the counter electrode 23 of the counter substrate 20 disposed facing the element substrate 10 via the liquid crystal layer 50. The alignment films 18 and 24 are inorganic alignment films as described above, and are composed of an aggregate of columnar bodies 18a and 24a, respectively, which are grown in a columnar shape by diagonally depositing of an inorganic material such as silicon oxide from a predetermined direction, for example. The liquid crystal molecules LC having negative dielectric anisotropy with respect to the alignment films 18 and 24 thus configured, have a pretilt angle θp of 3 to 5 degrees in the inclination direction of the columnar bodies 18a and 24a and is substantially aligned vertically (VA: Vertical Alignment), with respect to the normal direction of the alignment film surface. By applying an alternating drive signal between the pixel electrode 15 and the counter electrode 23 to drive the liquid crystal layer 50, the liquid crystal molecules LC behaves to tilt in the electric field direction occurred between the pixel electrode 15 and the counter electrode 23.

As such, on the base material 10s of the element substrate 10, there are provided a plurality of wiring layers in which the scanning line 3, the TFT 30, the data line 6, the storage capacitor 16, the wiring 8a, the pixel electrode 15, and the like are disposed. Among the plurality of wiring layers, the wiring layer according to the light-shielding structure of the TFT 30 of the first embodiment is a portion of the lower layers that are lower than the data line 6 close to the semiconductor layer 30a, and a structure of wiring layers of a related art, without a particular limitation, can be applied to the configuration of the upper layers that are upper than the data line 6.

1-3. Wiring Structure of Transistor

Figure 5:
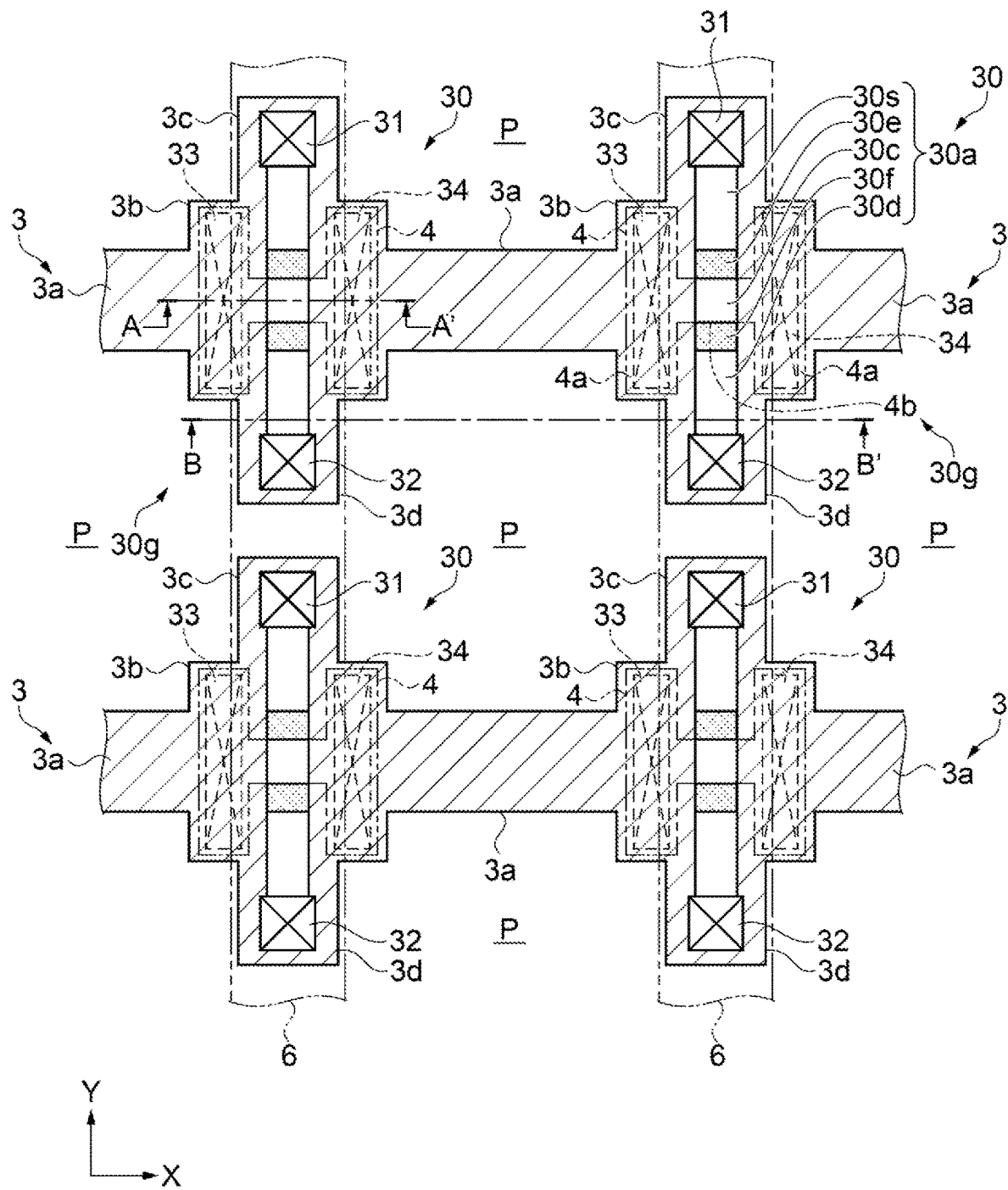
FIG. 5 is a plan view schematically illustrating an arrangement of transistors and signal wirings in an element substrate.
Figure 6:
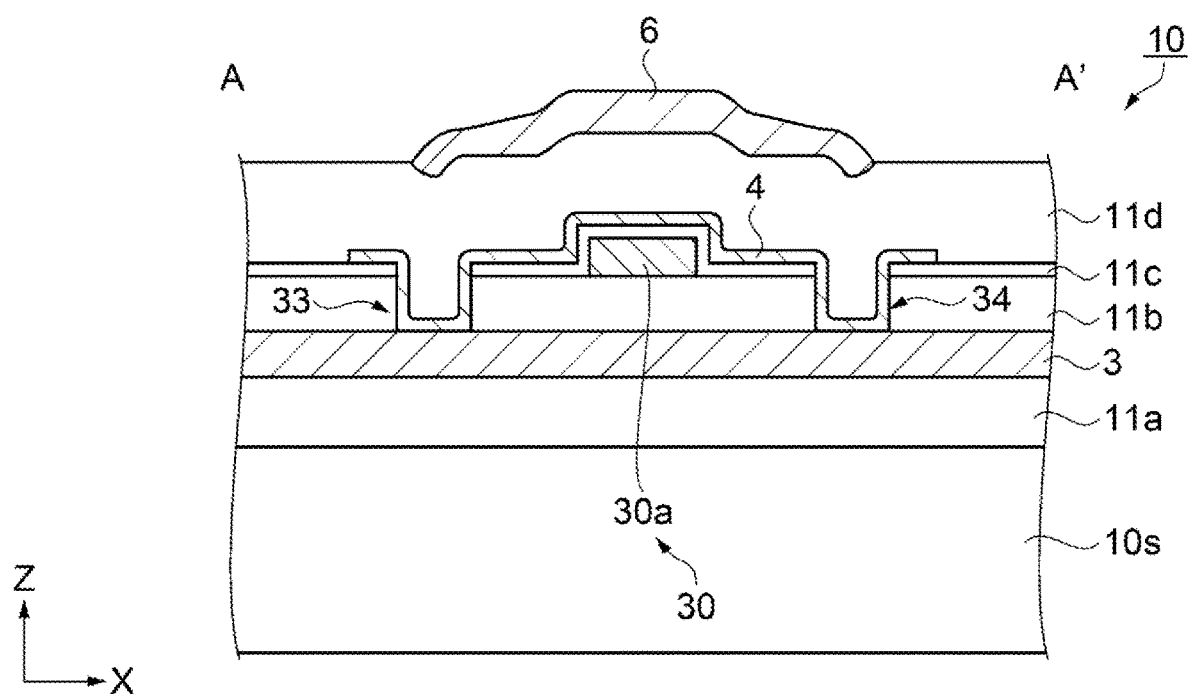
FIG. 6 is a cross-sectional view schematically illustrating a wiring structure of a transistor taken along line A-A' in FIG. 5.
Figure 7:
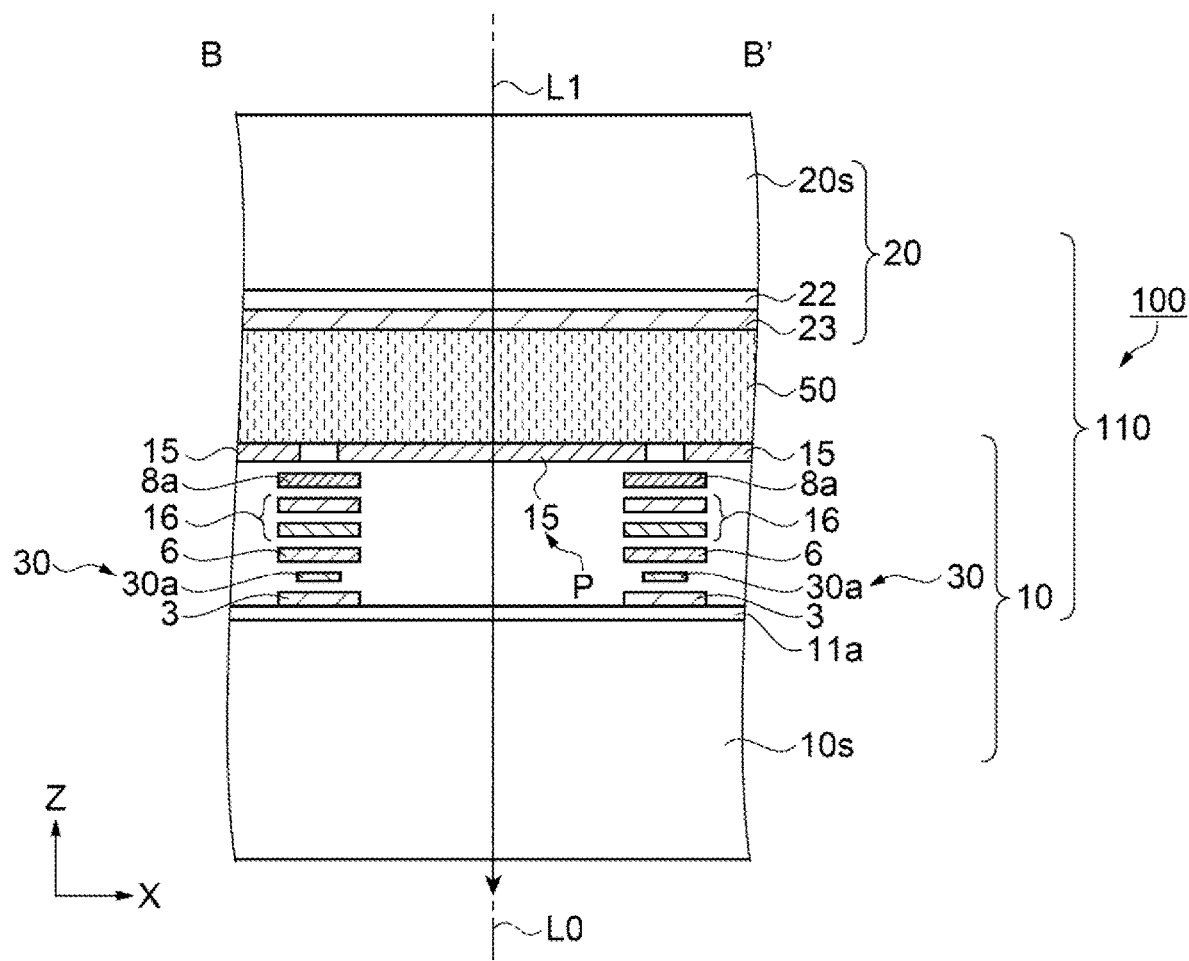
FIG. 7 is a cross-sectional view schematically illustrating a structure of a liquid crystal panel taken along line B-B' in FIG. 5.

Next, a wiring structure of the TFT 30 in the element substrate 10 of the first embodiment will be described below with reference to FIGS. 5 to 7. FIG. 5 is a plan view schematically illustrating an arrangement of transistors and signal wirings in the element substrate. FIG. 6 is a cross-sectional view schematically illustrating a wiring structure of the transistor taken along line A-A' in FIG. 5. FIG. 7 is a cross-sectional view schematically illustrating a structure of a liquid crystal panel taken along line B-B' in FIG. 5. Note that the line A-A' in FIG. 5 is a line segment that crosses, in the X direction, a channel region 30c in the semiconductor layer 30a of the TFT 30, and the line B-B' in FIG. 5 is a line segment that crosses, in the X direction. the drain side of the TFTs 30 adjacent to each other in the X direction.

As illustrated in FIG. 5, the scanning line 3 includes a main line portion 3a that also extends in the X direction across a plurality of pixels P aligned in the X direction, and an extended portion 3b with extended widths in both the X direction and in the Y direction with respect to the main line portion 3a. The scanning line 3 also includes a protruding portion 3c protruding in the Y direction from the extended portion 3b, and a protruding portion 3d protruding in the direction opposite to the Y direction from the extended portion 3b.

The semiconductor layer 30a of the TFT 30 is disposed along the Y direction to overlap in plan view with the extended portion 3b and the two protruding portions 3c and 3d of the scanning line 3.

The semiconductor layer 30a of the first embodiment forms an LDD structure formed by selectively implanting impurity ions into the polysilicon film, as described above. Specifically, the semiconductor layer 30a includes the channel region 30c, low-concentration impurity regions 30e and 30f that interpose the channel region 30c, a high-concentration impurity region 30s provided in contact with the low-concentration impurity region 30e on one side, and a high-concentration impurity region 30d provided in contact with the low-concentration impurity region 30f on the other side. The high-concentration impurity regions 30d and 30s are implanted with greater amount of impurity ions than the low-concentration impurity regions 30e and 30f, to thus enhance the conductivity of the high-concentration impurity regions 30d and 30s. The contact hole 31, configured for coupling the data line 6 with the high-concentration impurity region 30s, is provided at an end portion of the high-concentration impurity region 30s on one side. The contact hole 32, configured for coupling the first relay electrode 6b (see FIG. 4) with the high-concentration impurity region 30d, is provided at an end portion of the high-concentration impurity region 30d on the other side. Hereinafter, the low-concentration impurity regions 30e and 30f are referred to as LDD regions 30e and 30f, respectively. The high-concentration impurity region 30s at which the contact hole 31 is provided is referred to as source region 30s, and the high-concentration impurity region 30d at which the contact hole 32 is provided is referred to as drain region 30d.

The semiconductor layer 30a is disposed such that, in plan view, the channel region 30c is located at the approximate center of the extended portion 3b of the scanning line 3. An electrode 4 is disposed to overlap in plan view with the scanning line 3 and the semiconductor layer 30a thus configured. Specifically, the electrode 4 includes, in plan view, two extended portions 4a disposed on both sides along the semiconductor layer 30a and a narrowed portion 4b disposed between the two extended portions 4a to overlap with the channel region 30c of the semiconductor layer 30a.

Two contact holes 33 and 34 are provided at the extended portion 3b of the scanning line 3 to electrically couple the scanning line 3 and the electrode 4. The contact holes 33 and 34 are provided at both sides of the semiconductor layer 30a with the semiconductor layer 30a interposed in between in plan view. The narrowed portion 4b, which, in the electrode 4, overlaps in plan view with the channel region 30c of the semiconductor layer 30a, serves as the gate electrode 30g in the TFT 30. A scanning signal is also supplied to the electrode 4, as in the scanning line 3, via the contact holes 33 and 34. Note that one of the two contact holes 33 and 34 may be only provided to electrically couple the scanning line 3 and the electrode 4. In addition, a configuration may be employed, in which a wiring that links respective electrodes 4 adjacent to each other across the pixels P aligned in the X direction is provided and the scanning line 3 is a first scanning line and respective electrodes 4 coupled to each other are second scanning lines, to thus strengthen the electrical wiring system that supplies the scanning signal.

The data line 6 is provided extending in the Y direction to overlap in plan view with the extended portion 3b of the scanning line 3, the two protruding portions 3c and 3d protruding in the Y direction from the extended portion 3b, and the semiconductor layer 30a. The pixel P is in a state surrounded in plan view by the scanning line 3 extending in the X direction and the data line 6 extending in the Y direction. The scanning line 3 and the data line 6, which have light-shielding properties, render the region surrounded by the scanning line 3 and the data line 6 to be an opening region of the pixel P. In other words, the region where the scanning line 3 and the data line 6 are arranged in plan view forms a non-opening region having light-shielding properties.

As illustrated in FIG. 6, the first insulating film 11a is provided between the base material 10s and the scanning line 3. The second insulating film 11b is provided between the scanning line 3 and the semiconductor layer 30a of the TFT 30. The gate insulating film 11c is provided between the semiconductor layer 30a and the electrode 4. A first interlayer insulating film 11d is provided between the electrode 4 and the data line 6.

Through holes are formed through the second insulating film 11b and the gate insulating film 11c to the scanning line 3 at positions at which the second insulating film 11b and the gate insulating film 11c interpose the semiconductor layer 30a in the X direction. The electrodes 4 are formed covering inside the through holes to form two contact holes 33 and 34. The electrode 4 is composed using, for example, a conductive polysilicon, a metal such as Ti (titanium) or W (tungsten), an alloy of the metal, or a metal material such as nitride or silicide of the metal. The electrode 4 may have a single layer structure composed of these metal materials, or may have a multilayer structure composed of a different metal material.

According to such a wiring structure of the TFT 30, light advancing from the direction opposite to the Z direction toward the semiconductor layer 30a is blocked by the data line 6 and the electrode 4. Further, light passing through the base material 10s toward the semiconductor layer 30a is blocked by the scanning line 3. As illustrated in FIG. 5, two contact holes 33 and 34 are provided, on both sides of the semiconductor layer 30a, along the channel region 30c of the semiconductor layer 30a, and the LDD regions 30e and 30f that interpose the channel region 30c. Accordingly, light advancing from an oblique direction with respect to the Z direction toward the channel region 30c and the LDD regions 30e and 30f of the semiconductor layer 30a is blocked by the electrode 4 including the contact holes 33 and 34.

As illustrated in FIG. 7, the liquid crystal apparatus 100 is provided with the liquid crystal panel 110 including the element substrate 10 and the counter substrate 20 disposed facing each other across the liquid crystal layer 50.

On the base material 10s of the element substrate 10, there are provided a plurality of wiring layers in which the scanning line 3, the semiconductor layer 30a of the TFT 30, the data line 6, the storage capacitor 16, the wiring 8a, and the like are disposed. These electrical configurations provided at the plurality of wiring layers are arranged to overlap with outer edges of respective pixel electrodes 15 adjacent to each other in the X direction.

In the first embodiment, light is incident on the pixel P provided with the pixel electrode 15 from the counter substrate 20 side of the liquid crystal panel 110. The light L1 incident along the optical axis L0 passing the center of the pixel P passes through the counter substrate 20, the liquid crystal layer 50, and the pixel electrode 15 to exit from the base material 10s of the element substrate 10. The wiring 8a, the storage capacitor 16, and the data line 6 formed at the plurality of wiring layers of the element substrate 10 block light incident between the respective pixel electrodes 15 adjacent to each other in the X direction from reaching the semiconductor layer 30a.

The light L1 exiting from the base material 10s through the pixel electrode 15 may be reflected by, for example, a polarization element disposed in the advancing direction, and then stray light incident on the base material 10s again may occur. The stray light thus occurred is blocked by the scanning line 3 provided between the base material 10s and the semiconductor layer 30a, and hardly reach the semiconductor layer 30a. That is, the element substrate 10 has a wiring structure in which light incident on the pixel P and stray light due to the light passed through the pixel P hardly cause an optical leakage current at the TFT 30.

Moreover, the first insulating film 11a is provided between the base material 10s and the scanning line 3. The first insulating film 11a is composed of a silicon oxide film having the content of hydrogen (H) of not less than $1.0 \times 10^{19}$ atoms/cm$^3$ and less than $1.0 \times 10^{20}$ atoms/cm$^3$. Thus, compared to a case where the scanning line 3 is directly formed at the base material 10s, the hydrogen (H) is diffused, due to a high-temperature heat treatment in the process of forming the semiconductor layer 30a, from the first insulating film 11a into the semiconductor layer 30a. Thereby, sintering effect is obtained in which the crystal defects of the polysilicon film constituting the semiconductor layer 30a is repaired with hydrogen (H) that is heat-diffused, improving the electrical characteristics of the semiconductor layer 30a.

In addition, because the content of fluorine (F) contained in the silicon oxide film constituting the first insulating film 11a is less than $1.0 \times 10^{19}$ atoms/cm$^3$, the amount of fluorine (F) that is heat-diffused from the first insulating film 11a to the semiconductor layer 30a is restricted even though the above-described high-temperature heat treatment is performed, to thus suppress deterioration of electrical properties in the semiconductor layer 30a.

As described above, the data-line drive circuit 101 and the scanning line drive circuit 102 as peripheral circuits that drive and control the pixel circuit include Nch-TFT and Pch-TFT. These TFTs are also formed at the plurality of wiring layers of the element substrate 10. Between the wiring layer at the lowermost layer of the plurality of wiring layers and the base material 10s, there is provided the first insulating film 11a constituted by the silicon oxide film of the first embodiment. Thus, in the TFT 30 being switching element in the pixel P as well as in the semiconductor layer composed of polysilicon film of Nch-TFT and Pch-TFT in the peripheral circuits, the sintering effect due to hydrogen (H) heat-diffused from the first insulating film 11a is obtained. In addition, the amount of fluorine (F) that is heat-diffused from the first insulating film 11a is restricted. That is, the liquid crystal apparatus 100 provided with TFTs having superior characteristics can be provided. Note that heat diffusion of hydrogen (H) from the first insulating film 11a is possible in the high-temperature heat treatment that is applied when forming of the semiconductor layer as well as after the formation of the semiconductor layer.

1-4. Examples and Comparative Examples

Next, evaluation results of the silicon oxide film of the first embodiment will be described with reference to examples and comparative examples of the wiring structure of a thin film transistor (TFT) including the silicon oxide film.

Example 1

The wiring structure of the TFT of Example 1, which bases on the wiring structure of the element substrate 10 of the first embodiment described above, used a quartz substrate for the base material 10s. A silicon oxide film with a film thickness of approximately 1 μm was formed as the first insulating film 11a on the quartz substrate. The method of forming the silicon oxide film of Example 1 was performed in which a silicon oxide film was formed by HDP-CVD method under a deposition pressure of 10 Pa or less using a film forming gas including monosilane ($SiH_4$), oxygen ($O_2$), and argon (Ar) being a carrier gas. Next, a semiconductor layer composed of a polysilicon film was formed at the silicon oxide film formed by HDP-CVD method. The semiconductor layer is a polysilicon film obtained by subjecting an amorphous silicon film to a thermal treatment at a high temperature of 1000° C. to form the polysilicon film. Impurity ions were selectively implanted into the semiconductor layer composed of the polysilicon film to form Nch-TFT of Example 1.

Comparative Example 1

The wiring structure of the TFT of Comparative Example 1 is basically the same as the wiring structure of the TFT of Example 1, except that a silicon oxide film with a film thickness of approximately 1 μm was formed, between the quartz substrate and the semiconductor layer, by PE-CVD method under a deposition pressure of 100 Pa or greater using a film forming gas including TEOS, oxygen ($O_2$), and helium (He) being a carrier gas. Next, a semiconductor layer including a polysilicon film was formed at the silicon oxide film formed by PE-CVD method. The semiconductor layer is a polysilicon film obtained by subjecting an amorphous silicon film to a thermal treatment at a high temperature of 1000° C. to form the polysilicon film. Impurity ions were selectively implanted into the semiconductor layer composed of the polysilicon film to form Nch-TFT of Comparative Example 1.

The silicon oxide films of Example 1 and Comparative Example 1 were evaluated using a test piece in which the silicon oxide film is film formed at the quartz substrate. The contents of hydrogen (H) and fluorine (F) contained in the silicon oxide film of the test piece were measured by secondary ion mass spectrometry (SIMS: Secondary Ion Mass Spectrometry). Likewise, the contents of hydrogen (H) and fluorine (F) contained in the silicon oxide film of the test piece after subjecting the silicon oxide film to a heat treatment at 1000° C. for 5 minutes was measured by SIMS. Further, the test piece after the heat treatment was etched immersed in a hydrofluoric acid (HF) solution with a concentration of 1.0 mass % for a prescribed time, and the reduced amount of film due to the etching of the silicon oxide film was measured to determine the etching rate per unit of time. The evaluation results of the silicon oxide films in Example 1 and Comparative Example 1 are listed in Table 1 below. In Table 1, "as Depo" indicates after the film formation, and "+Anneal" indicates after the heat treatment.

TABLE 1

| Silicon oxide film | as Depo | | +Anneal | | Etching rate [nm/min] by 1 wt % HF |
|---|---|---|---|---|---|
| | F [atoms/cm$^3$] | H [atoms/cm$^3$] | F [atoms/cm$^3$] | H [atoms/cm$^3$] | |
| Comparative Example | 7.10E+19 | 6.00E+20 | 6.70E+19 | 1.80E+20 | 60 |
| Example 1 | 3.20E+18 | 5.80E+20 | 4.20E+18 | 1.40E+19 | Not greater than 20 |

As listed in Table 1, the content of hydrogen (H) contained in the silicon oxide film after the film formation does not exhibit a significant difference between Example 1 and Comparative Example 1, where after the heat treatment, the content of hydrogen (H) in Example 1 is less than $1.40 \times 10^{19}$[atoms/cm$^3$], which is one digit less than Comparative Example 1 in which the content of hydrogen (H) is $1.80 \times 10^{20}$[atoms/cm$^3$]. Accordingly, it can be contemplated that the silicon oxide film of Example 1 has a thermally stable structure compared to Comparative Example 1, and thus hydrogen (H) contained during the film formation is separated with ease. It can be contemplated that the silicon oxide film of Comparative Example 1 has a thermally unstable structure, and thus hydrogen (H) contained during the film formation is trapped by silicon to make the hydrogen (H) difficult to be separated.

On the other hand, the content of fluorine (F) contained in the silicon oxide film after the film formation in Comparative Example 1 and Example 1 is $3.20 \times 10^{18}$[atoms/cm$^3$] in Example 1, which is one digit less than Comparative Example 1 in which the content of fluorine (F) is $7.10 \times 10^{19}$ [atoms/cm$^3$]. Accordingly, it can be contemplated that the silicon oxide film of Example 1 is formed under a deposition pressure of 10 Pa or less by HDP-CVD method, and thus impurities such as fluorine (F) is in a reduced state compared to the silicon oxide film of Comparative Example 1 formed by PE-CVD method. Further, the tendency of the content of fluorine (F) remains unchanged even after the heat treatment, and the content of fluorine (F) in Example 1 is one digit less than Comparative Example 1.

Moreover, it can be contemplated that the etching rate of the silicon oxide film of Example 1 is less than Comparative Example 1, and the film density is higher than Comparative Example 1, and thus the silicon oxide film assumes a silicon oxide film having thermal stability that is close to the quartz substrate. Note that the etching rate of the quartz substrate is 6.8 [nm/min].

Example 2

In the wiring structure of the TFT of Example 2, Pch-TFT was formed by changing, in comparison with Example 1, the method of implanting impurity ions into the semiconductor layer. The other wiring structures are the same as in Example 1.

Comparative Example 2

In the wiring structure of the TFT of Comparative Example 2, Pch-TFT was formed by changing, in comparison with Comparative Example 1, the method of implanting impurity ions into the semiconductor layer. The other wiring structures are the same as in Comparative Example 1.

Figure 8:
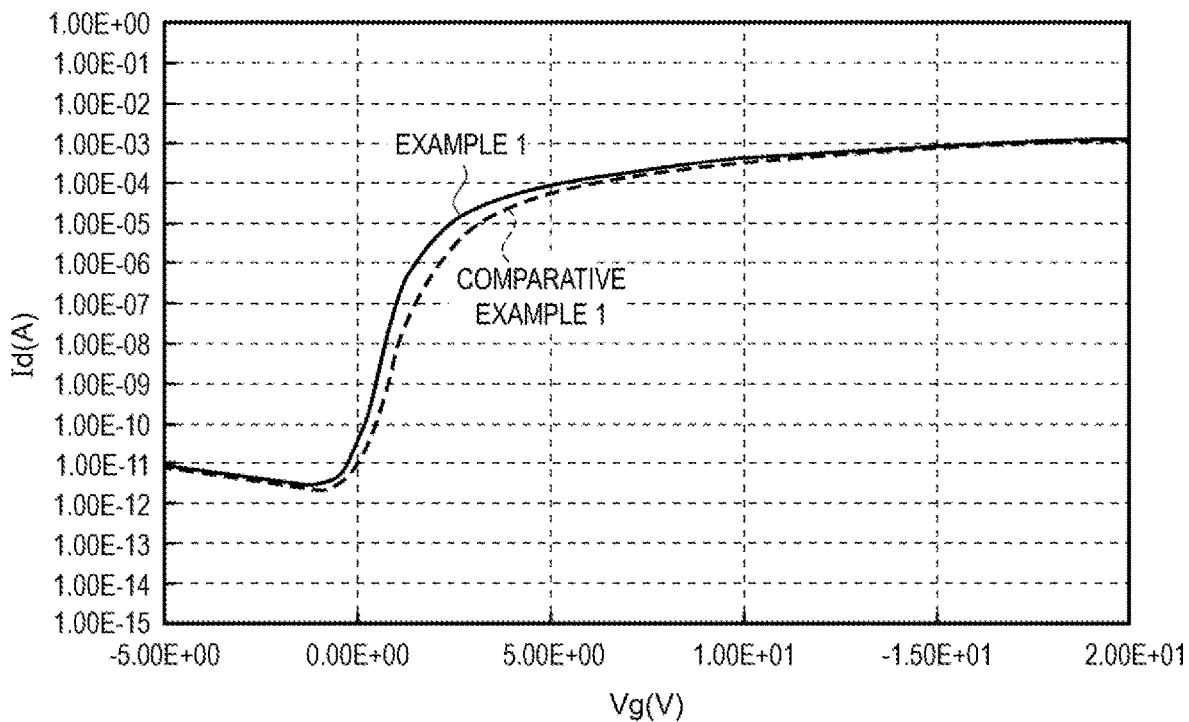
FIG. 8 is a graph illustrating electrical characteristics of Nch thin film transistors in wiring structures of Example 1 and Comparative Example 1.
Figure 9:
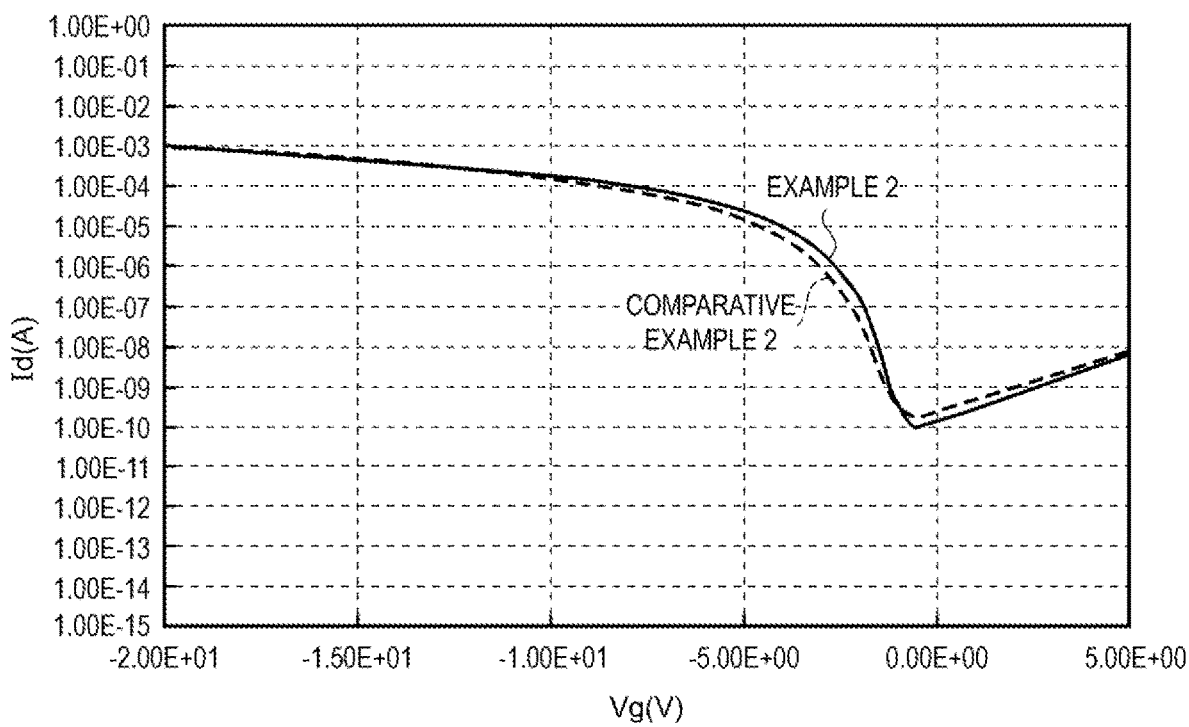
FIG. 9 is a graph illustrating electrical characteristics of Pch thin film transistors in wiring structures of Example 2 and Comparative Example 2.

Next, electrical characteristics of the thin film transistors in the wiring structures using the silicon oxide film of the examples and comparative examples will be described below with reference to FIGS. 8 and 9. FIG. 8 is a graph illustrating electrical characteristics of Nch thin film transistors in the wiring structures of Example 1 and Comparative Example 1. FIG. 9 is a graph illustrating electrical characteristics of Pch thin film transistors in the wiring structures of Example 2 and Comparative Example 2. The electrical characteristics of the thin film transistors (TFT) illustrated in FIGS. 8 and 9 indicate the variation of a current value Id (A) at the drain end of the TFT with applied voltage of 15 V between the source and drain of the TFT to vary a gate voltage Vg (V) with reference to 0V.

As illustrated in FIG. 8, in case of Nch-TFT, more slight variation of the gate voltage Vg of Example 1 than Comparative Example 1 caused a large variation of the current value Id. That is, the Nch-TFT of Example 1, which has sub-threshold value (S value) smaller than Comparative Example 1, has superior switching characteristics.

As illustrated in FIG. 9, in case of Pch-TFT of Example 2, which has sub-threshold value (S value) smaller than Comparative Example 2 as in Nch-TFT, has superior switching characteristics.

According to Example 1 and Example 2, the first insulating film 11a may include a silicon oxide film having the content of hydrogen (H) of not less than $1.0 \times 10^{19}$ atoms/cm$^3$ and less than $1.0 \times 10^{20}$ atoms/cm$^3$, in order to obtain the sintering effect of the semiconductor layer due to hydrogen (H) heat-diffused from the first insulating film 11a provided between the quartz substrate and the semiconductor layer. Further, the content of fluorine (F) contained in the silicon oxide film may be less than $1.0 \times 10^{19}$ atoms/cm$^3$.

In order to heat-diffuse the hydrogen (H) contained in the silicon oxide film, the silicon oxide film may have high thermal stability in film density, and the etching rate using HF solution of 1 wt % as an indicator for determining the film density of the silicon oxide film may be not less than 6.8 [nm/min] and not greater than 20 [nm/min].

In the first embodiment described above, the TFT 30 of Nch type is used for the switching element of the pixel P. Accordingly, the liquid crystal apparatus 100 provided, for each of the pixels P, with the TFT 30 with superior switching characteristics can be provided. Further, as stated in Example 2 described above, the use of the silicon oxide film of the first embodiment enables achieving superior switching characteristics, even for Pch-TFT. In the liquid crystal apparatus 100, peripheral circuits such as the data-line drive circuit 101 and the scanning line drive circuit 102 for driving a pixel circuit including the TFT 30 are configured including Nch-TFT and Pch-TFT as described above. Accordingly, a use of the silicon oxide film of the first embodiment in the pixel circuits and the peripheral circuits enables achieving the liquid crystal apparatus 100 that can be driven at high speeds and at high frequencies even when the number of pixels has a resolution of 4K exceeding the full high vision image quality.

The TFT 30 of Nch type of the pixel P incorporates a light-shielding structure such that light incident on the pixel P does not cause an optical leakage current. Thus, a light-shielding film such as the scanning line 3 is necessary between the semiconductor layer 30a of the TFT 30 and the base material 10s.

On the other hand, peripheral circuits such as the data-line drive circuit 101 and the scanning line drive circuit 102 provided in a peripheral region outside the display region E1 enable the partition portion 21 provided at the counter substrate 20, a chassis for housing the liquid crystal panel 110, or the like to block light incident on the peripheral circuit. Thus, the light-shielding film may not necessarily be provided between the base material 10s of the element substrate 10, and the semiconductor layer of Nch-TFT and the semiconductor layer of Pch-TFT. The lack of the light-shielding film causes the hydrogen (H) contained in the first insulating film 11a constituted by the silicon oxide film of the first embodiment to be easily heat-diffused into the semiconductor layer of Nch-TFT and the semiconductor layer of Pch-TFT. That is, the semiconductor layer of Nch-TFT and the semiconductor layer of Pch-TFT of the peripheral circuits that are exempted from being provided with a light-shielding film more reliably ensure the sintering effect due to the heat-diffused hydrogen (H) than the semiconductor layer 30a of the TFT 30 of Nch type of the pixel P.

Further, in case of providing a light-shielding film between the base material 10s and the semiconductor layer of TFT in the element substrate 10, the light-shielding film may include a metal or a metal compound devoid of silicon. This prevents, due to the light-shielding film devoid of silicon, hydrogen (H) in the silicon oxide film from being trapped by silicon. That is, the light-shielding film devoid of silicon hardly inhibits heat-diffusion of hydrogen (H) from the silicon oxide film.

2. Second Embodiment 2-1. Electro-optical Device

Figure 10:
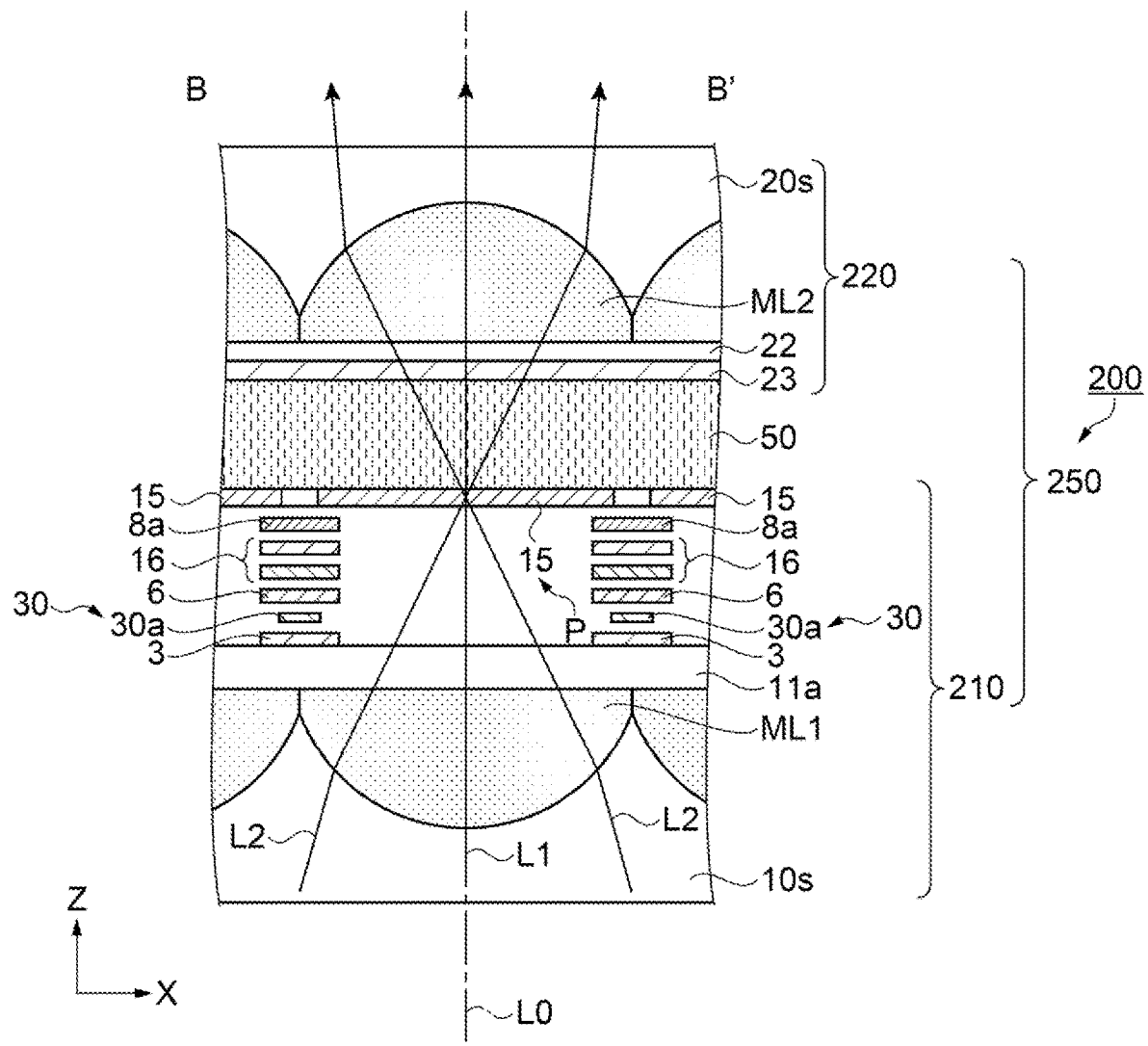
FIG. 10 is a cross-sectional view schematically illustrating a structure of a liquid crystal panel of a liquid crystal apparatus as an electro-optical device according to a second embodiment.

Next, an electro-optical device according to the second embodiment will be described with reference to FIG. 10 by exemplifying a compact liquid crystal apparatus that can be used for a light modulation unit of a projection-type display apparatus to be described below, as in the first embodiment described above. The liquid crystal apparatus of the second embodiment includes a microlens array in each of the element substrate and the counter substrate for the liquid crystal apparatus 100 of the first embodiment described above. Accordingly, in the liquid crystal apparatus of the second embodiment, the same configurations as in the configurations in the liquid crystal apparatus 100 of the first embodiment described above are denoted by the same reference signs, and detailed description of the same configurations will be omitted. FIG. 10 is a cross-sectional view schematically illustrating a structure of a liquid crystal panel of a liquid crystal apparatus as an electro-optical device according to the second embodiment. Specifically, FIG. 10 is a view corresponding to FIG. 7 of the first embodiment described above, and is a schematic cross-sectional view taken along line B-B' in FIG. 5.

As illustrated in FIG. 10, a liquid crystal apparatus 200 of the second embodiment includes a liquid crystal panel 250 including an element substrate 210 and a counter substrate 220 disposed facing the element substrate 210 being intervened by the liquid crystal layer 50. The optical design of the liquid crystal panel 250 is a normally-black mode that the negative dielectric anisotropic liquid crystal molecules are substantially vertically oriented in the liquid crystal layer 50.

The element substrate 210 includes a base material 10s, a pixel electrode 15 provided at the base material 10s, and a plurality of wiring layers provided between the base material 10s and the pixel electrode 15. The plurality of wiring layers is formed with the scanning line 3, the semiconductor layer 30a of the TFT 30, the data line 6, the storage capacitor 16, the wiring 8a, and the like from the base material 10s side. Further, a microlens ML1 is provided, at the base material 10s, for each of the pixels P. That is, the base material 10s is provided with a microlens array including a plurality of microlenses ML1. The first insulating film 11a composed of the silicon oxide film of the second embodiment is provided between the base material 10s and the scanning line 3 thus configured.

The counter substrate 220 includes a base material 20s, a counter electrode 23 provided at the base material 20s, and the planarization layer 22 provided between the base material 20s and the counter electrode 23. Further, a microlens ML2 is provided, at the base material 20s, for each of the pixels P. That is, the base material 20s is provided with a microlens array including a plurality of microlenses ML2.

A method of forming the microlens array at the element substrate 210 is performed, for example, such that one surface of the base material 10s is selectively etched to form, for each of the pixels P, a hemispherical lens surface being convex to the opposite side from the liquid crystal layer 50. A lens material with refractive index greater than the base material 10s is deposited to fill the lens surface. Because unevenness occurs on the one surface of the base material 10s on which the lens material has been deposited, a flattening treatment is performed to eliminate the unevenness. This allows the microlens ML1 to be formed, for each of the pixels P, on the base material 10s. Then, a silicon oxide film of the second embodiment is formed covering the plurality of microlenses ML1 to form the first insulating film 11a. The content of hydrogen (H) contained in the silicon oxide film of the second embodiment is not less than $1.0 \times 10^{19}$ atoms/cm$^3$ and less than $1.0 \times 10^{20}$ atoms/cm$^3$. Further, the content of fluorine (F) contained in the silicon oxide film of the second embodiment is less than $1.0 \times 10^{19}$ atoms/cm$^3$. Examples of such a method of forming the silicon oxide film include, as in the first embodiment described above, a method of forming the silicon oxide film, by plasma CVD method or high density plasma CVD method, using a film forming gas including monosilane (SiH$_4$), oxygen (O$_2$), and a carrier gas such as argon (Ar) or helium (He).

The method of forming the microlens array in the counter substrate 220 is also the same as with the element substrate 210. That is, one surface of the base material 20s is selectively etched to form, for each of the pixels P, a hemispherical lens surface being convex to the opposite side from the liquid crystal layer 50. A lens material with refractive index greater than the base material 20s is deposited to fill the lens surface. Because unevenness occurs on the one surface of the base material 20s on which the lens material has been deposited, a flattening treatment is performed to eliminate the unevenness. This allows the microlens ML2 to be formed, for each of the pixels P, on the base material 20s. Then, the planarization layer 22 is formed covering the plurality of microlenses ML2.

Note that the method of forming the microlens array in the element substrate 210 and the counter substrate 220 is not limited to a method in which one surface of the base material is selectively etched to form a lens surface, and the insulating film deposited on the one surface of the base material may be selectively etched to form a lens surface.

In the liquid crystal apparatus 200 of the second embodiment, light is made incident on the pixel P from the element substrate 210 side of the liquid crystal panel 250. The light L1 incident along the optical axis L0 of the pixel passes through the base material 10s, the microlens ML1, the pixel electrode 15, the liquid crystal layer 50, the counter electrode 23, and the microlens ML2 to exit from the base material 20s of the counter substrate 220. The scanning line 3 formed at the wiring layer at the lowermost layer of the element substrate 210 blocks light incident between the respective microlenses ML1 adjacent to each other in the X direction from reaching the semiconductor layer 30a.

The light L2 incident on the pixel P from an oblique direction with respect to the optical axis L0 is converged by the microlens ML1 at the element substrate 210 side, and is then inflected in a direction approximately along the optical axis L0 by the microlens ML2 at the counter substrate 220 side to exit. That is, the liquid crystal apparatus 200, which can converge light incident on the pixel P from the element substrate 210 side and can cause the light to exit from the counter substrate 220 side, enables to effectively use light incident on the liquid crystal panel 250 from the light source to make a bright display possible.

In the element substrate 210, the first insulating film 11a provided between the base material 10s on which the microlens ML1 is formed and the scanning line 3 has a function of adjusting the focal position on the optical axis L0 of light converged by the microlens ML1. Specifically, adjusting the film thickness of the first insulating film 11a enables adjusting the focal position on the optical axis L0. The focal position is adjusted such that light converged by the microlens ML1 focuses away from the wiring provided at the plurality of wiring layers. Although varied depending on the optical design of the microlens ML1 corresponding to the planar size of the pixel P, the film thickness of the first insulating film 11a of the second embodiment ranges from 2.5 μm to 24.0 μm, for example. As such, the film thickness of the first insulating film 11a that is made thicker than 1 μm ensures, due to the high temperature heat treatment involved in the formation of the semiconductor layer 30a, a sufficient amount of hydrogen (H) diffused from the silicon oxide film constituting the first insulating film 11a to the semiconductor layer 30a being a polysilicon film. That is, the sintering effect of repairing crystal defects in the polysilicon film with the diffused hydrogen (H) is reliably ensured in the semiconductor layer 30a in the TFT 30 of the pixel P, as well as in the semiconductor layer of Nch-TFT and the semiconductor layer of Pch-TFT of the peripheral circuits. This allows provision of the liquid crystal apparatus 200 provided with the TFT having superior electrical properties.

Note that the liquid crystal apparatus 200 of the second embodiment has a configuration premising that light is made incident from the element substrate 210 side of the liquid crystal panel 250, however, the liquid crystal apparatus 200 may have a configuration of microlens array in which light is made incident from the counter substrate 220 side.

3. Third Embodiment

3-1. Electronic Apparatus

Figure 11:
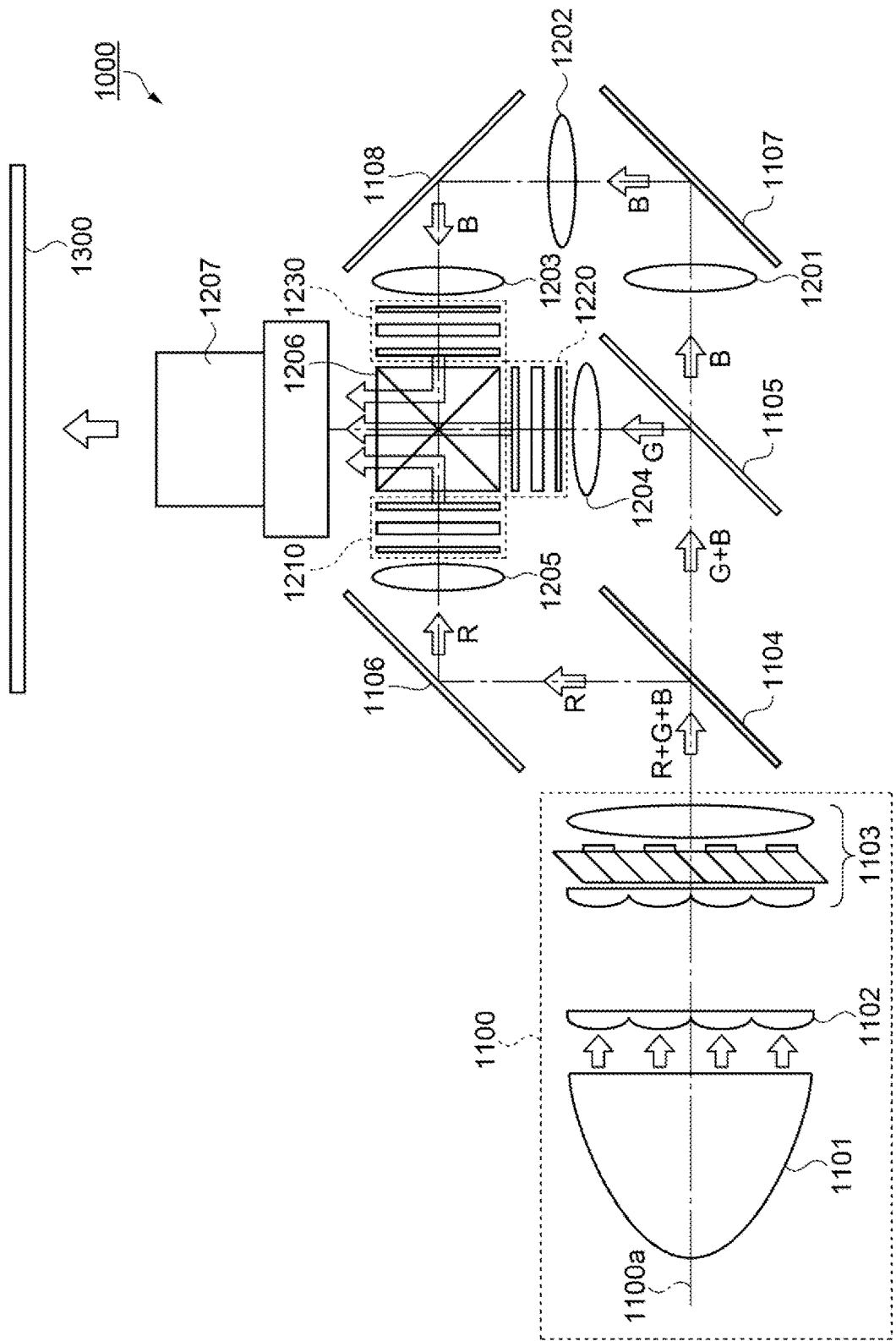
FIG. 11 is a view schematically illustrating a configuration of a projection-type display apparatus as an electronic apparatus according to a third embodiment.

Next, a projection-type display apparatus will be described as an example of an electronic apparatus according to the third embodiment. FIG. 11 is a view schematically illustrating a configuration of a projection-type display apparatus as an electronic apparatus according to the third embodiment.

As illustrated in FIG. 11, a projection-type display apparatus 1000 as an electronic apparatus according to the third embodiment includes a polarized light illumination device 1100, two dichroic mirrors 1104 and 1105 as light separation elements, three reflection mirrors 1106, 1107, and 1108, and five relay lenses 1201, 1202, 1203, 1204, and 1205, which are disposed along a system optical axis 1100a. The projection-type display apparatus 1000 further includes liquid crystal light valves 1210, 1220, and 1230 of a transmissive-type as three light modulation units, a cross dichroic prism 1206 as a photosynthetic element, and a projection lens 1207, which are disposed along the system optical axis 1100a passing through the relay lenses 1203, 1204, and 1205.

The polarized light illumination device 1100 generally includes a lamp unit 1101 being as a light source including a white light source such as an extra-high pressure mercury lamp or a halogen lamp, an integrator lens 1102, and a polarization conversion element 1103.

The dichroic mirror 1104 reflects the red light (R) of a polarized light flux exiting from the polarized light illumination device 1100 and transmits the green light (G) and the blue light (B). The other dichroic mirror 1105 reflects the green light (G) transmitted by the dichroic mirror 1104 and transmits the blue light (B).

The red light (R) reflected by the dichroic mirror 1104 is reflected by the reflection mirror 1106 and is then incident on the liquid crystal light valve 1210 via the relay lens 1205.

The green light (G) reflected by the dichroic mirror 1105 is incident on the liquid crystal light valve 1220 via the relay lens 1204.

The blue light (B) transmitted by the dichroic mirror 1105 is incident on the liquid crystal light valve 1230 via a light guide system including the three relay lenses 1201, 1202, and 1203 and the two reflection mirrors 1107 and 1108.

The liquid crystal light valves 1210, 1220, and 1230 are each disposed facing an incident surface of each type of color light of the cross dichroic prism 1206. The color light incident on the liquid crystal light valves 1210, 1220, and 1230 is modulated based on video information (video signal) and exits toward the cross dichroic prism 1206. This prism includes four rectangular prisms bonded together, where on inner surfaces of the prisms, a dielectric multilayer film configured to reflect the red light and a dielectric multilayer film configured to reflect the blue light are formed in a cross shape. The three types of color light are synthesized by these dielectric multilayer films, and light representing a color image is synthesized. The synthesized light is projected onto a screen 1300 by the projection lens 1207 being a projection optical system, and an image is enlarged to be displayed.

The liquid crystal light valve 1210 is a valve to which the liquid crystal apparatus 100 of the third embodiment described above is applied. A pair of light-polarization elements disposed in a crossed-Nicols state on the incident side and the emission side of the color light of the liquid crystal panel 110 are disposed with a gap interposed between the pair of polarization elements. The same applies to the other liquid crystal light valves 1220 and 1230.

According to the projection-type display apparatus 1000 thus configured, the liquid crystal apparatus 100 including the element substrate 10 with a TFT having superior electrical properties is used for the liquid crystal light valves 1210, 1220, and 1230, thus providing the projection-type display apparatus 1000 by which a stable display quality is obtained even when driven at high speeds and at high frequencies.

Note that an equivalent effect can be obtained even when the liquid crystal apparatus 200 of the second embodiment described above is used for the liquid crystal light valves 1210, 1220, and 1230. Also note that the projection-type display apparatus 1000 according to the third embodiment uses, but not limited to, a white light source such as an extra-high pressure mercury lamp, a halogen lamp, or the like. For example, the projection-type display apparatus 1000 may use, for example, a solid-state light source such as a laser light source and an LED compatible with each of red light (R), green light (G), and blue light (B).

The disclosure is not limited to the embodiments described above, and various modifications and improvements may be added to the embodiments described above. Such modifications will be described below.

Modification 1

The microlens array is, but not limited to, provided on both the element substrate 210 and the counter substrate 220 as in the liquid crystal apparatus 200 of the second embodiment described above. It suffices that a configuration in which a microlens array be provided on at least the element substrate 210. This allows the film thickness of the first insulating film 11a having a function of adjusting focal length to become greater than a case where the microlens array is not provided. This ensures the sintering effect in the semiconductor layer due to the hydrogen (H) heat-diffused from the first insulating film 11a. Further, the microlens array formed at the element substrate 210 is, but not limited to, a configuration in which one microlens ML1 is provided for each of the pixel P, and a plurality of microlenses may be formed on the optical axis L0. This enables enhancing the efficiency of use of light incident on the element substrate 210 side.

Modification 2

The wiring structure of the thin film transistor (TFT) of the embodiments described above can be applied to, but not limited to, an electro-optical device such as a transmissive liquid crystal apparatus, and can be applied to a reflection-type lid crystal device having light-reflective properties as well. For example, the present disclosure can also be applied to a top-emission type light-emitting device in which a light-emitting element is disposed at the pixel P. Examples of the light-emitting element include an organic EL element including an organic light-emitting layer as an electro-optical layer between the pixel electrode and the counter electrode.

Modification 3

The liquid crystal apparatus of the embodiments described above can be applied to, but not limited to, the projection-type display apparatus 1000. For example, the counter substrate 20 of the liquid crystal apparatus 100 may include color filters corresponding to at least red (R), green (G), and blue (B), and the liquid crystal light valve may have a single plate configuration. In addition, the liquid crystal apparatus 100 can be used suitably as, for example, a display unit of a projection-type Head-Up Display (HUD), a Head-Mounted Display (HMD), an electronic book, a personal computer, a digital still camera, a liquid crystal television, a view finder-type or monitor direct view-type video recorder, a car navigation system, an electronic diary, and an information terminal device such as Point Of Sale (POS) terminal. Likewise, the liquid crystal apparatus 200 can be used suitably.

Contents derived from the embodiments will be described below.

A substrate for an electro-optical device of the present disclosure includes a base material, a transistor disposed on the base material, the transistor including a semiconductor layer, and a silicon oxide film disposed between the base material and the semiconductor layer, in which a content of hydrogen in the silicon oxide film is not less than $1.0 \times 10^{19}$ atoms/cm$^3$ and less than $1.0 \times 10^{20}$ atoms/cm$^3$.

According to the configuration of the present disclosure, setting the content of hydrogen in the silicon oxide film to be within the range described above results in an easy separation of the hydrogen from the silicon oxide film due to the heat treatment when forming of the semiconductor layer or after the formation of the semiconductor layer. This makes it possible to achieve a semiconductor layer in which electrical defects have been repaired with the separated hydrogen. That is, a substrate for an electro-optical device including a transistor having superior characteristics can be provided.

In the substrate for an electro-optical device described above, the semiconductor layer includes a polysilicon film.

According to the above configuration, sintering effect is obtained in which crystal defects of a polysilicon film are repaired with the hydrogen separated from the silicon oxide film, thus achieving a semiconductor layer having electrical stability.

In the substrate for an electro-optical device described above, a content of fluorine in the silicon oxide film may be less than $1.0 \times 10^{19}$ atoms/cm$^3$.

According to the above configuration, the fluorine content in the silicon oxide film, which is less than $1.0 \times 10^{19}$ atoms/cm$^3$, suppresses deterioration of characteristics of the transistor due to the fluorine diffused into the semiconductor layer. In other words, a substrate for an electro-optical device including a transistor having further superior characteristics can be provided.

In the substrate for an electro-optical device described above, an etching rate of the silicon oxide film using hydrofluoric acid with a concentration of 1.0 mass % may be not less than 6.8 nm/min and not greater than 20 nm/min.

According to the above configuration, a substrate for an electro-optical device including a silicon oxide film with high film density and thermal stability can be provided.

In the substrate for an electro-optical device described above, a microlens array including microlenses arranged for each of pixels may be provided between the base material and the silicon oxide film.

According to the above configuration, light incident on the base material side can be converged for each of the pixels with the microlenses. Further, adjusting the film thickness of the silicon oxide film enables adjusting the focal position of the microlens. Thus, a use of such a substrate for an electro-optical device makes a bright display possible, and achieves an electro-optical device with superior electro-optical characteristics.

In the substrate for an electro-optical device described above, a light-shielding film may be provided, between the silicon oxide film and the semiconductor layer, in a region overlapping in plan view with the semiconductor layer, in which the light-shielding film may include a metal or a metal compound devoid of silicon.

According to the above configuration, light incident on the semiconductor layer from the base material side can be blocked by the light-shielding film to suppress an occurrence of optical leakage current in the transistor. Further, the light-shielding film devoid of silicon enables preventing the hydrogen in the silicon oxide film from being trapped by silicon. That is, a substrate for an electro-optical device can be provided including a transistor that hardly cause an optical leakage current due to incident light and having superior characteristics.

In the substrate for an electro-optical device described above, a film thickness of the silicon oxide film may be not less than 1 μm.

According to the above configuration, electrical defects in the semiconductor layer are sufficiently repaired with the hydrogen contained in the silicon oxide film, and thus a substrate for an electro-optical device including a transistor having superior characteristics can be provided.

The electro-optical device of the present disclosure includes the substrate for an electro-optical device described above, a counter substrate, and an electro-optical layer disposed between the substrate for an electro-optical device and the counter substrate, in which the electro-optical layer is configured to be electrically driven by the transistor of the substrate for an electro-optical device.

According to the configuration of the present disclosure, an electro-optical device with superior electro-optical characteristics can be provided.

An electronic apparatus according to the present disclosure includes the electro-optical device described above.

According to the configuration of the present disclosure, an electronic apparatus with superior display quality can be provided.

What is claimed is:

1. A substrate for an electro-optical device, the substrate comprising:
   a base material comprising a transparent quartz substrate or a glass substrate;
   a transistor including a semiconductor layer, and the semiconductor layer including a polysilicon film;
   a first insulating film comprising a first silicon oxide film, wherein
   the first silicon oxide film comprises fluorine and hydrogen,
   a content of the fluorine in the first silicon oxide film is less than $1.0 \times 10^{19}$ atoms/cm$^3$, and
   a content of the hydrogen in the first silicon oxide film is $1.0 \times 10^{19}$ atoms/cm$^3$ or more but less than $1.0 \times 10^{20}$ atoms/cm$^3$;
   a second insulating film comprising a second silicon oxide film or a silicon nitride film; and
   a light-shielding film disposed between the first insulating film and the second insulating film, the first insulating film, the light-shielding film and the second insulating film being disposed between the base material and the semiconductor layer, and the transistor being disposed on the second insulating film.

2. The substrate for an electro-optical device according to claim 1, wherein
   the light-shielding film is disposed between the first insulating film and the semiconductor layer in a region overlapping the semiconductor layer in plan view, and
   the light-shielding film includes metal or a metal compound devoid of silicon.

3. The substrate for an electro-optical device according to claim 1, wherein a film thickness of the first insulating film is 1 µm or more.

4. An electro-optical device comprising:
- the substrate for an electro-optical device according to claim 1;
- a counter substrate; and
- an electro-optical layer disposed between the substrate for an electro-optical device and the counter substrate, wherein
- the electro-optical layer is configured to be electrically driven by the transistor of the substrate for an electro-optical device.

5. An electronic apparatus comprising the electro-optical device according to claim 4.

* * * * *